United States Patent
Hristov et al.

(10) Patent No.: US 12,018,963 B2
(45) Date of Patent: Jun. 25, 2024

(54) PROXIMITY SENSOR DEVICE AND SYSTEM

(71) Applicant: Melexis Bulgaria Ltd, Sofia (BG)

(72) Inventors: Hristo Angelov Hristov, Sofia (BG); Dieter Verstreken, Tessenderlo (BE); Rumen Marinov Peev, Sofia (BG); Kostadin Ivanov, Sofia (BG); Kostadin Dimitrov Bobchev, Sofia (BG)

(73) Assignee: MELEXIS BULGARIA LTD., Sofia (BG)

( * ) Notice: Subject to any disclaimer, the term of this patent is extended or adjusted under 35 U.S.C. 154(b) by 256 days.

(21) Appl. No.: 17/410,419

(22) Filed: Aug. 24, 2021

(65) Prior Publication Data

US 2022/0065664 A1    Mar. 3, 2022

(30) Foreign Application Priority Data

Aug. 31, 2020   (EP) .................................... 20472010

(51) Int. Cl.
    *G01D 5/20*      (2006.01)
    *B60R 22/18*     (2006.01)
    *H01L 23/522*    (2006.01)
    *H01L 49/02*     (2006.01)

(52) U.S. Cl.
    CPC ............. *G01D 5/204* (2013.01); *B60R 22/18* (2013.01); *H01L 23/5225* (2013.01); *H01L 23/5227* (2013.01); *H01L 28/10* (2013.01); *B60R 2022/1806* (2013.01)

(58) Field of Classification Search
    CPC ..................................................... G01D 5/204
    USPC ..................................................... 324/207.16
    See application file for complete search history.

(56) References Cited

U.S. PATENT DOCUMENTS

| | | | |
|---|---|---|---|
| 5,808,587 A * | 9/1998 | Shima ...................... | H01Q 1/38 340/10.52 |
| 8,203,335 B2 | 6/2012 | Feldtkeller | |
| 10,566,409 B2 * | 2/2020 | Lesenco ............. | H01L 23/5225 |
| 2010/0207611 A1 | 8/2010 | Thoss et al. | |
| 2015/0145348 A1 | 5/2015 | Preg et al. | |

(Continued)

FOREIGN PATENT DOCUMENTS

DE    102012214330 B3    4/2014

OTHER PUBLICATIONS

Extended European Search Report from corresponding EP Application No. 20472010.6, dated Jan. 27, 2021.

*Primary Examiner* — Vincent Q Nguyen
(74) *Attorney, Agent, or Firm* — Workman Nydegger

(57) ABSTRACT

A monolithic integrated proximity sensor device includes a semiconductor substrate with an active surface with at least one active or passive component or bond pad; an interconnection stack having a plurality of at least two metal layers; at least a first transmitter coil having a first spiral course with at least three turns formed in at least one or at least two metal layers and defining the first region having a first inner and outer periphery; at least a first receiver coil having a second spiral course with at least three turns formed in at least one or at least two metal layers and defining a second region having a second inner and outer periphery. At least one component or bond pad is located inside the first or second inner periphery.

22 Claims, 22 Drawing Sheets

(56) References Cited

U.S. PATENT DOCUMENTS

2017/0148732 A1* 5/2017 Kuwajima .............. H01L 24/48
2017/0302273 A1 10/2017 Kántor et al.

* cited by examiner

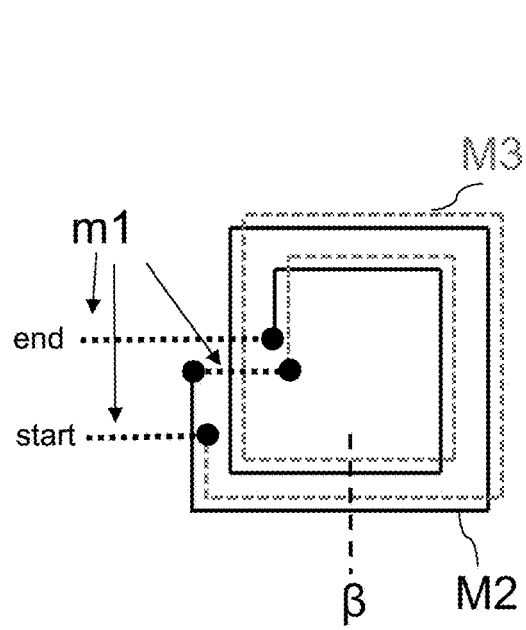
FIG 9(a)
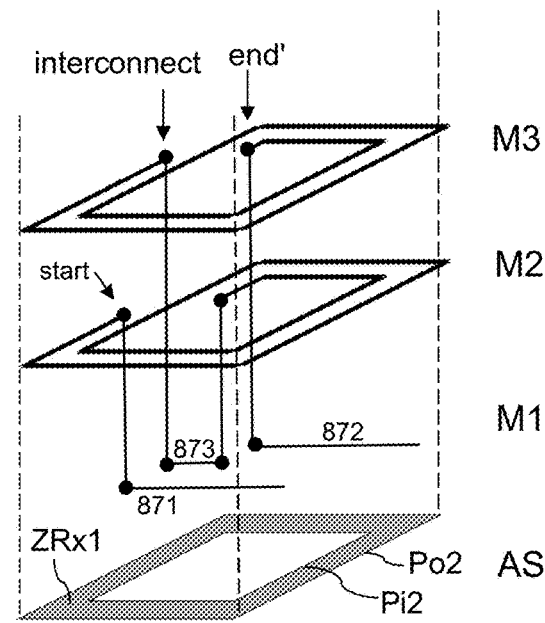
FIG 9(b)
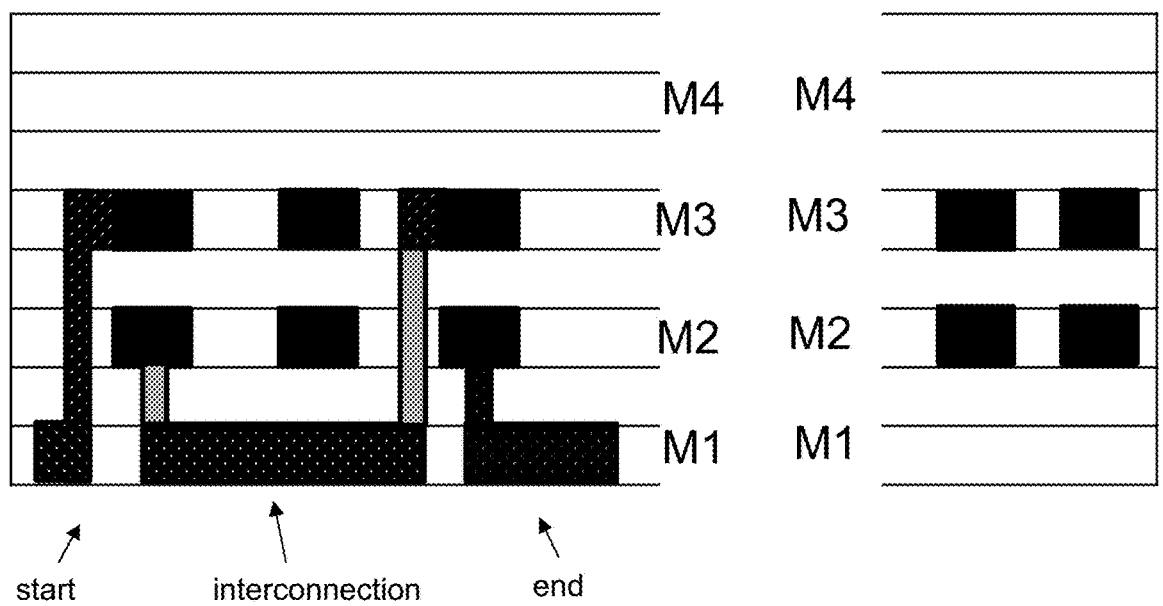
FIG 9(c)
FIG 9(d)

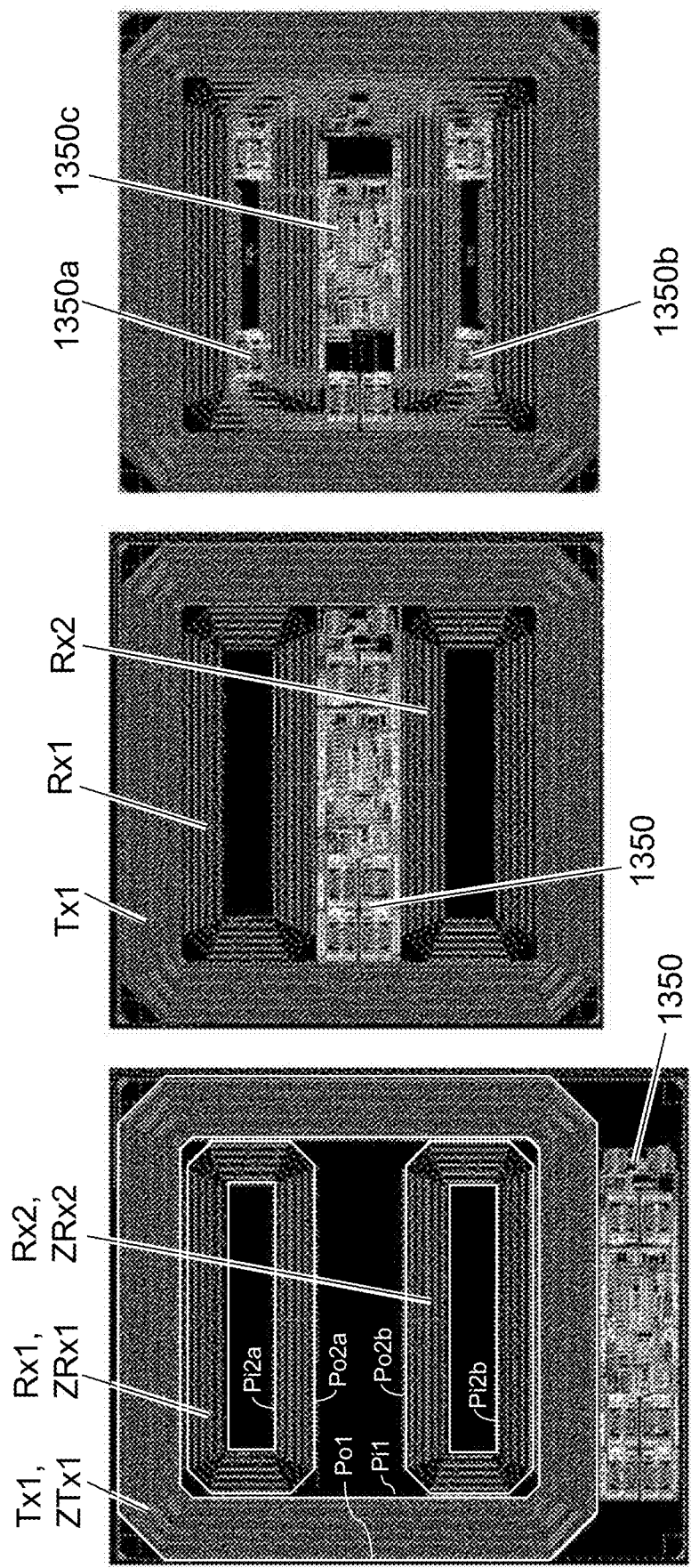

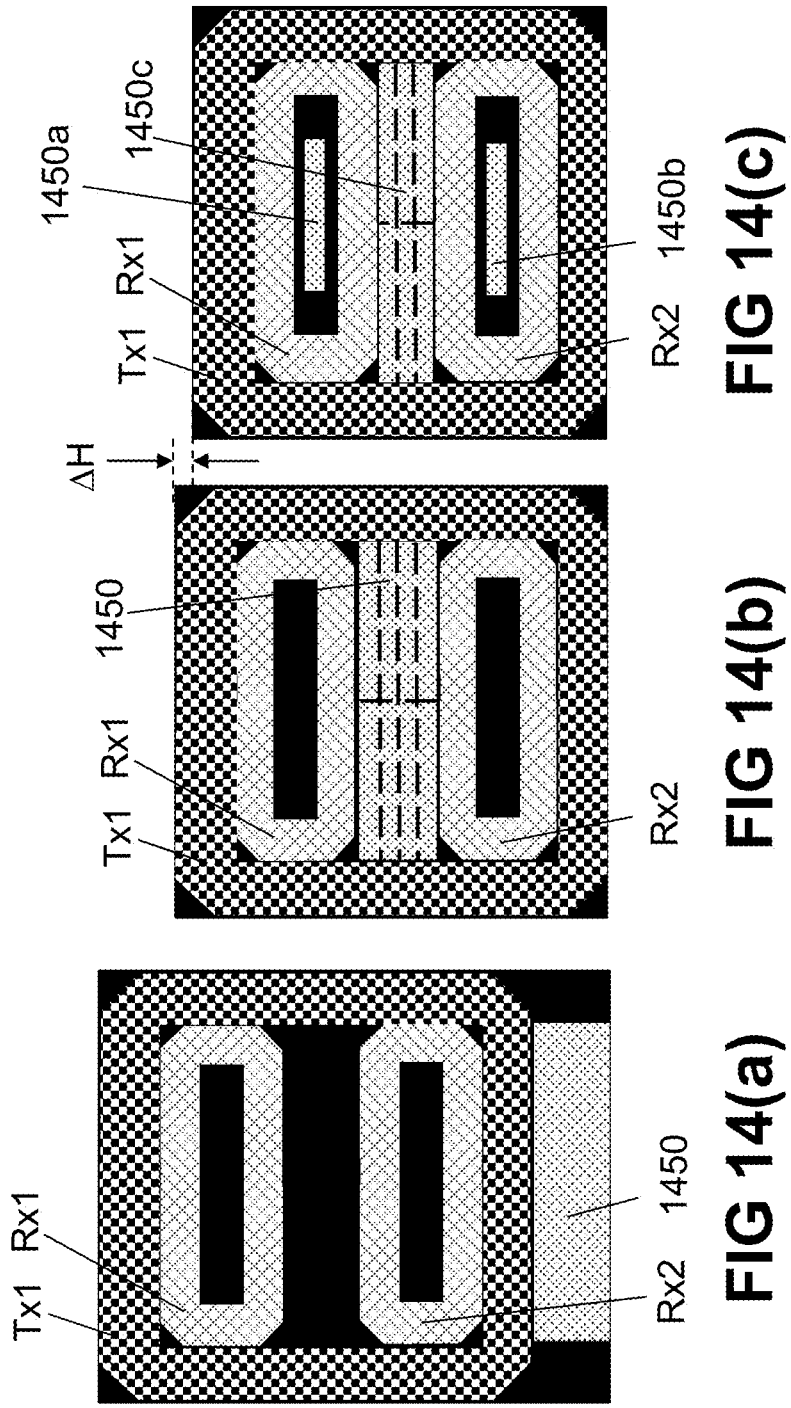

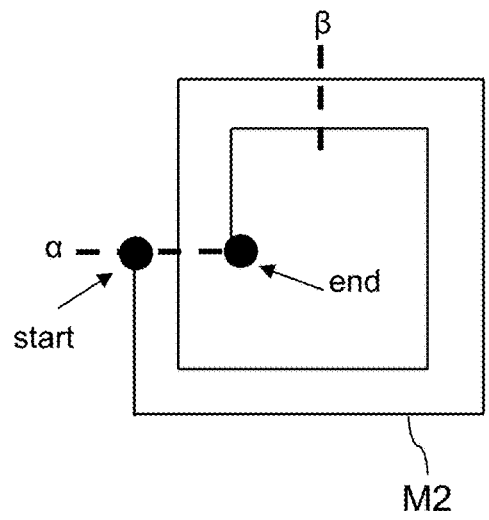
FIG 18(a)
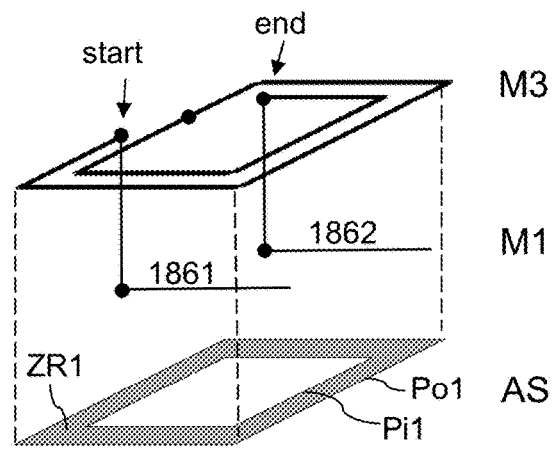
FIG 18(b)
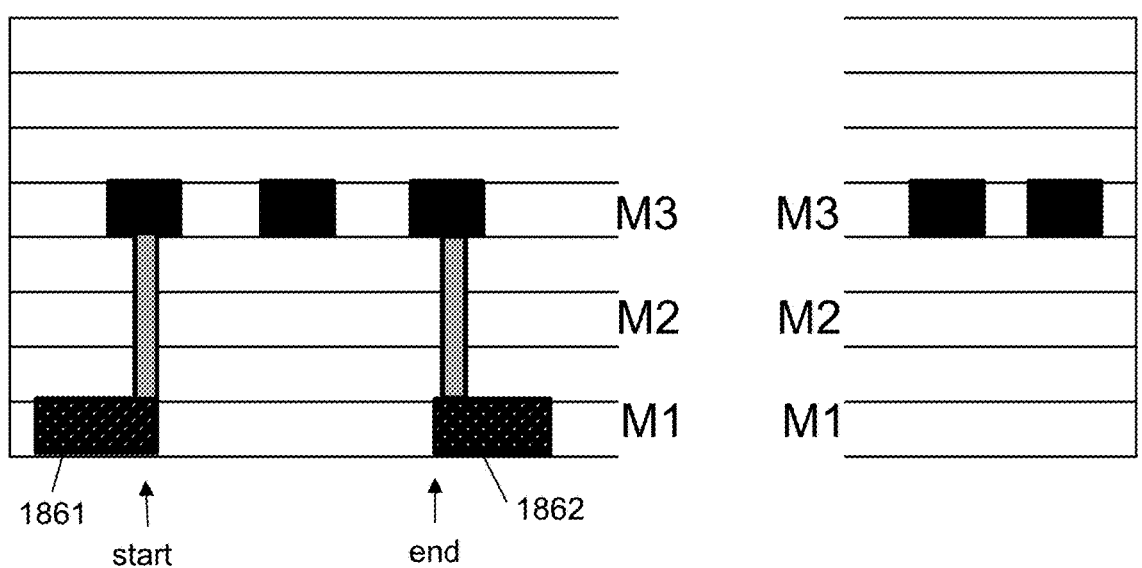
FIG 18(c)
FIG 18(d)

PROXIMITY SENSOR DEVICE AND SYSTEM

FIELD OF THE INVENTION

The present invention relates in general to the field of proximity sensors, and more in particular to inductive proximity sensor devices and systems.

BACKGROUND OF THE INVENTION

Proximity sensor devices and proximity sensor systems are known in the art. They are typically based on sensing a static magnetic field generated by a permanent magnet, or by sensing a dynamic magnetic field generated by a transmitter coil conducting an alternating current. A characteristic of the magnetic field is changed depending on the position of a movable object (e.g. a "metal target").

The present invention is directed to proximity sensors of the inductive type, also sometimes referred to as "inductive proximity switch", because the sensor device typically only has to differentiate between one of two possible positions of the target.

An example of an inductive proximity switch is described in U.S. Pat. No. 8,203,335.

There is always room for improvements or alternatives.

SUMMARY OF THE INVENTION

It is an object of embodiments of the present invention to provide a proximity sensor device.

It is also an object of the present invention to provide a proximity sensor system comprising such a device and a target which is movably arranged relative to said device, e.g. an electrically conductive target (e.g. a metal target, or a printed circuit board with a conductive layer or with conductive tracks), or a magnetic target (e.g. a ferromagnetic target, or a target comprising ferromagnetic particles).

It is an object of embodiments of the present invention to provide a proximity sensor device capable of reliably detecting the presence of an electrically conductive target or a magnetic target at a distance (air-gap) up to a predefined distance from the device. The predefined distance may be up to 0.5 mm from the device, or up to 1.0 mm, or up to 1.5 mm, or up to 2.0 mm, or even up to 2.5 mm, or even up to 3.0 mm.

It is an object of embodiments of the present invention to provide a monolithic integrated proximity sensor device, capable of reliably detecting the presence of an electrically conductive target (e.g. a metal target) or a magnetic target at a distance up to the predefined distance from the device.

It is an object of embodiments of the present invention to provide a monolithic integrated proximity sensor device, capable of reliably detecting the presence of an electrically conductive target (e.g. a metal target) or a magnetic target at a distance up to the predefined distance from the device, produced in a standard CMOS process.

It is an object of embodiments of the present invention to provide a monolithic integrated proximity sensor device, capable of reliably detecting the presence of an electrically conductive target (e.g. a metal target) or a magnetic target at a distance up to the predefined distance from the device, produced in a standard CMOS process having a single semiconductor substrate with an area smaller than 6.25 mm2, or smaller than 5.5 mm$^2$, or smaller than 5.0 mm$^2$, or smaller than 4.5 mm$^2$, or smaller than 4.0 mm$^2$, or smaller than 3.5 mm$^2$, or smaller than 3.0 mm$^2$.

It is an object of embodiments of the present invention to provide such a proximity sensor device consuming less than 50 mWatt, or less than 40 mWatt, or less than 30 mWatt, or less than 20 mWatt, e.g. typically consuming about 15 mWatt.

These and other objects are accomplished by a proximity sensor device, and a proximity sensor system according to embodiments of the present invention.

According to a first aspect, the present invention provides a proximity sensor device, comprising a single monolithic integrated semiconductor substrate comprising: an active surface comprising at least one component selected from the group consisting of: an active component, a passive component, and a bond pad; an interconnection stack on top of the active surface, the interconnection stack comprising a plurality of at least two metal layers separated by isolation layers; at least a first transmitter coil and a first receiver coil electrically insulated from one another, the first transmitter coil having a first spiral course with at least three turns formed in a first subset of at least one or at least two metal layers selected from said plurality of metal layers, and wherein an orthogonal projection of the first spiral course on the active substrate has a first inner periphery and a first outer periphery; the first receiver coil having a second spiral course with at least three turns formed in a second subset of at least one or at least two metal layers selected from said plurality of metal layers, and wherein an orthogonal projection of the second spiral course on the active substrate has a second inner periphery and a second outer periphery; and wherein said at least one component is located inside the first inner periphery and inside the second inner periphery, or is located inside the first inner periphery but outside of the second outer periphery.

The "single monolithic integrated semiconductor substrate" may comprise silicon.

The proximity sensor device may be implemented in a packaged chip (also known as Integrated Circuit, IC), having a plurality of pins (or leads) extending from the package. The package may be a ceramic package or a plastic package.

It is a major advantage that at least one component (preferably a relatively large component, and/or multiple components) is/are located inside the first inner periphery and optionally also inside the second inner periphery, as opposed to leaving this space (on the inside of the coils) "empty", because this allows for a more efficient use of the area of the active surface and/or allows for a more flexible layout, and/or allows a larger transmitter coil and/or allows a larger receiver coil. Or stated in other words, allows the "empty space" (i.e. amount of area of the "active surface" that is not used for components) to be reduced. It is noted that the expression "active surface of a semiconductor substrate" has a well-known meaning in the field of semiconductors, which does not need to be further explained here.

It is not trivial in the field of integrated circuits, to locate at least one component (e.g. active/passive component, or bond-pad or capacitor-array) inside the zone which is overlaid by the transmitter coil and/or by the receiver coil, because it was expected that either:

(a) in case the transmit power would be low, the operation or interconnection of the component would not be disturbed, but the receiver signal (induced by inductive coupling) would be too weak to be reliably detected, (b) in case the transmit power would be high, the receiver signal would be sufficiently strong to be reliably detected, but the operation or interconnection of the component would be disturbed.

It was also not known in the field of integrated circuits which kind of components could be placed inside said zone. It is only after designing and building and evaluating a number of test-chips that the inventors surprisingly discovered that it is indeed possible to locate some components inside said zone, while still being able to reliably determine a position of an electrically conductive target (e.g. a metal target) or a magnetic target relative to the integrated proximity sensor device (also referred to herein as "inductive switch"), and/or to reliably detect the presence or absence of said target in the vicinity of said switch.

Instead of saying that an orthogonal projection of the first spiral course on the active substrate has or defines a first inner periphery and a first outer periphery, one could also say that a projection of the first spiral course defines a first region, e.g. a first ribbon shaped region having or defining said first inner and outer periphery. Likewise, instead of saying that an orthogonal projection of the second spiral course on the active substrate has or defines a second inner and outer periphery, one could also say that a projection of the second spiral course defines a second region, e.g. a second ribbon shaped region having or defining said second inner and outer periphery.

The first subset and the second subset may share at least one metal layer, or stated in other words: may have at least one metal layer in common. But this is not absolutely required for the invention to work.

In preferred embodiments, an orthogonal projection of the outer periphery of the at least one receiver coil is located inside an orthogonal projection of the inner periphery of the at least one transmitter coil. Or stated in simple terms: the at least one receiver coil is implemented inside a space defined by the transmitter coil.

Preferably, a projection of the windings of the transmitter coil and the receiver coil(s) are not overlapping, and are not intertwined (e.g. as illustrated in FIG. 13(a) and FIG. 15(a). Or stated in other words, preferably the first ribbon-shaped region (e.g. ZTx1) and the second ribbon-shaped region (e.g. ZRx1) are non-overlapping regions.

It is an advantage that this allows the transmitter coil(s) and receiver coil(s) to be designed independent from each other in contrast e.g. to prior art where the transmit windings and the receiver windings are geometrically related.

Preferably no components (more specifically: no active components such as transistors, no passive components such as resistors or capacitors, and no bond pads) are located "under" the transmitter windings, or "under" the receiver windings. Or stated in other words, preferably no components are located between the first inner periphery and the first outer periphery, and preferably no components are located between the second inner periphery and the second outer periphery. Or stated in yet other words, preferably the transmitter windings and the receiver windings are not running "vertically above" active components such as transistors, or above passive components such as resistors or capacitors, or above bondpads.

In preferred embodiments of the present invention, preferably at least 1%, or at least 2%, or at least 5%, or at least 10%, or at least 15%, or at least 20%, or at least 25%, or at least 30%, or at least 40%, or at least 50%, or at least 60%, or at least 70% of the area inside the inner periphery of the first receiver coil is occupied by one or more active or passive components, and/or by bond pads, by parts of analog circuitry, and/or by parts of digital circuitry, as opposed to existing circuits where the area "under the coils" is left unused.

It is a major advantage of locating one or more active or passive components or bond pads, etc. inside the inner periphery of the first receiver coil, because otherwise these components would have to be located elsewhere, which would increase the size of the semiconductor substrate, or would decrease the area overlaid by the windings of the coils, or both. In other words, by locating one or more of the above-mentioned components inside said inner periphery, the size and thus the cost of the semiconductor substrate can be reduced, or the performance of the inductive switch can be improved, or both.

In an embodiment, the transmitter coil comprises only a single spiral, implemented in a single metal layer.

In an embodiment, the transmitter coil comprises at least two spirals, each spiral implemented in a different metal layer. Preferably the two spirals are located substantially on top of each other. The two spirals may be situated in two adjacent metal layers, e.g. in M1 and M2, or in M2 and M3, or in M3 and M4. Alternatively, the the two spirals may be situated in two metal layers which are not adjacent, for example M1 and M3, or M2 and M4. The two TX spirals may be interconnected by a plurality of vias. These vias may be oriented perpendicular to the semiconductor substrate.

In an embodiment, the receiver coil comprises only a single spiral, implemented in a single metal layer.

In an embodiment, the receiver coil comprises at least two spirals, each implemented in a different metal layer. These two spirals may be connected in series.

In an embodiment, the receiver coil comprises at least two spirals, each spiral implemented in a different metal layer. These spirals may be connected located substantially on top of each other and may be interconnected by a plurality of vias.

In an embodiment, the receiver spiral is implemented in a single metal layer (e.g. M3), and the transmitter coil is implemented in two metal layers, including one metal layer (e.g. M4) situated above the layer in which the receiver coil is implemented, and one metal layer (e.g. M2) situated below the metal layer in which the receiver coil is implemented.

In an embodiment, the interconnection stack has only four metal layers (M1 to M4, M1 being closest to the active surface of the semiconductor surface), and the at least one spiral of the at least one transmitter coil Tx1 is/are implemented in only one or only two of these four metal layers, and the spirals of the at least one receiver coil Rx1 is also implemented in only one or only two of these four metal layers.

In an embodiment, the Tx1 spirals are implemented in only three metal layers, and the Rx1 spirals are implemented in only two metal layers.

In an embodiment, the Tx1 spirals are implemented in only two metal layers, and the Rx1 spirals are implemented in only three metal layers.

In an embodiment, the Tx1 spirals are implemented in only three metal layers, and the Rx1 spirals are implemented in only three metal layers.

It is an advantage that at least one metal layer (preferably M1, closest to the substrate) can be used to connect the spirals to the transmitter circuit and the receiver circuit. This metal layer can also be used to interconnect the different spirals of the receiver coil.

In an embodiment, the at least one transmitter coil is excited at a frequency in the range from 10 to 50 MHz, or from 15 to 40 MHz, or from 15 to 30 MHz, e.g. equal to about 20 MHz, or equal to about 24 MHz.

In an embodiment, the first transmitter coil comprises at least ten windings.

In an embodiment, the first receiver coil comprises at least ten windings.

In an embodiment, the sensor device is a coreless sensor device, i.e. does not comprise an integrated magnetic concentrator (IMC). It is an advantage that such a sensor device is easier and cheaper to produce.

In another embodiment, the sensor device further comprises an integrated magnetic concentrator (IMC). It is an advantage of such a sensor device that the flux concentration can be improved.

In an embodiment, the first transmitter coil is formed in only one metal layer, and the first receiver coil is formed in only metal layer equal to the metal layer in which the first transmitter coil is formed.

In an embodiment, the first transmitter coil is formed in only one metal layer, and the first receiver coil is formed in only metal layer different from the metal layer in which the first transmitter coil is formed.

In an embodiment, the first transmitter coil (Tx1) is formed in a first subset of the interconnection stack, the first subset containing at least two metal layers, and the first subset and the second subset have at least one metal layer in common.

In an embodiment, the first transmitter coil is formed in a first subset of the interconnection stack, the first subset containing at least two metal layers, and the first receiver coil is formed in a second subset of the interconnection stack, the second subset containing at least two metal layers; and wherein the first subset and the second subset have at least one or at least two metal layers in common.

In an embodiment, the proximity sensor device further comprises: a transmitter circuit comprised in said active surface, and connected to the first transmitter coil (e.g. Tx1), and configured for transmitting an alternating signal; a receiver circuit comprised in said active surface, and connected to the first receiver coil (e.g. Rx1), and configured for receiving said alternating signal; an evaluation circuit comprised in or connected to the receiver circuit, and configured for determining a condition and/or position of an electrically conductive target or a magnetic target, based on the received alternating signal, more in particular, a position relative to the proximity sensor device.

The electrically conductive target may be a metal target, e.g. in the form of a metal sheet or a metal plate, e.g. a metal plate having a substantially rectangular shape without openings, or a metal plate having a substantially rectangular shape with two openings, e.g. rectangular openings, which are offset from each other, e.g. as shown in FIG. 10(a).

The magnetic target may be a composed of a ferromagnetic material or may comprise ferromagnetic particles.

In an embodiment, the target is made of, or comprises stainless steel.

In an embodiment, the electrically conductive target comprises a printed circuit board with electrically conducting zones, and electrically non-conducting zones.

In an embodiment, the proximity sensor device is further configured for outputting the determined condition, e.g. via a digital output port, via a serial interface, via an analog output port, via a "two-wire" interface (e.g. compatible with "two-wire LIN"), via an open-drain switch, etc.

In an embodiment, the proximity sensor device further comprises an integrated capacitor connected in series or in parallel with the at least one transmitter coil so as to form an LC resonator having a resonance frequency in a predefined range, and the transmitter circuit is configured for inducing a forced oscillation of the LC resonator at a frequency below its resonance frequency.

In contrast to parasitic capacitance, the capacitance of an integrated capacitor is much better defined and is not or much less sensitive to temperature variations. Hence, by adding the capacitor C, the resonance frequency can be set, and does not substantially drift with temperature.

In an embodiment the proximity sensor device comprises a resistor and a capacitor and a feedback circuit forming an RC oscillator, embedded in the semiconductor substrate.

In an embodiment, an orthogonal projection of at least one of said resistor and capacitor and feedback circuit is situated inside an orthogonal projection of the transmitter coil Tx1 and/or inside an orthogonal projection of the receiver coil(s).

In an embodiment, the evaluation circuit is further configured for determining whether the target is in a first predefined position or a second predefined position, and for outputting a corresponding (analog or digital) signal or value, or for opening or closing an internal switch between two terminals of the proximity sensor device.

In an embodiment, the transmitter circuit is configured for modulating a base signal with a carrier frequency in the range from 12 MHz to 30 MHz, and the receiver circuit may be configured for demodulating the received signal.

The transmitter circuit may comprise a BPSK (binary phase shift keying) modulator.

The receiver circuit may comprise a BPSK (binary phase shift keying) demodulator.

In an embodiment, the receiver circuit is configured for synchronously demodulating the received signal with said carrier frequency. The demodulation may occur in two consecutive steps, for example a first down-mix from the carrier frequency to an intermediate frequency in the range from about 0.5 MHz to 5 MHz (e.g. from 24 MHz to 1 MHz), and a second down-mix from the intermediate frequency to DC.

In an embodiment, an orthogonal projection of the outer periphery of the at least one receiver coil is situated completely within an orthogonal projection of the inner periphery of the first transmitter coil. Or stated in other words, preferably the second ribbon-shaped region ZRx1 is situated completely inside the inner periphery of the first ribbon-shaped region ZTx1.

In an embodiment, the proximity sensor device further comprises at least one metal shield in the form of a plurality of at least two tracks located on top of each other in at least two layers (e.g. M2 and M3; or M3 and M4; or M2 and M4) of the interconnection stack, which tracks are interconnected by a plurality of vias, wherein the at least one metal shield is located between the inner periphery of the transmitter coil and the outer periphery of the receiver coil, or between the inner periphery of the transmitter coil and at least one component located inside said inner periphery, or between the inner periphery of the receiver coil and at least one component located inside said inner periphery.

In an embodiment, the proximity sensor device comprises only two coils, namely said first transmitter coil (e.g. Tx1) and said first receiver coil (e.g. Rx1), and the area between the inner and outer periphery of the transmitter coil (also referred to herein as the area of the first ribbon-shaped region ZTx1) amounts to 36% to 44% of the active area; and the area between the inner and outer periphery of the receiver coil (also referred to herein as the area of the second ribbon-shaped region ZRx1) amounts to 15% to 25% of the active area.

Thus, in this embodiment, the ribbon-shaped regions (i.e. part of the active surface "under" the coil windings, where no components are placed) together occupy from 41% to 69% of the active area of the semiconductor substrate, meaning there is only 31% to 59% left for placing active/passive components, or bond-pads.

In an embodiment, the substrate further comprises a second receiver coil (e.g. Rx2) electrically insulated from the first transmitter coil (e.g. Tx1); the second receiver coil has a third spiral course with at least three turns formed in a third subset of at least one or at least two metal layers selected from said plurality of metal layers; and an orthogonal projection of the third spiral course on the active surface is situated completely within the inner periphery of the first transmitter coil.

This can also be formulated as follows: wherein an orthogonal projection of the third spiral course on the active substrate defines a third ribbon-shaped region ZRx2; and wherein the second ribbon-shaped region ZRx2 and the third ribbon-shaped region ZRx3 are both situated completely inside the inner periphery of the first ribbon-shaped region ZTx1 of the transmitter coil.

Preferably the second ribbon-shaped region (e.g. ZRx2) and the third ribbon-shaped region (e.g. ZRx3) do not overlap, but are distinct regions.

The first subset and the third subset may share at least one metal layer (e.g. M3 or M4), but that is not absolutely required.

The second receiver coil may be electrically connected in series or in parallel with the first receiver coil.

In an embodiment, the first transmitter coil comprises three spirals connected in parallel, each spiral being implemented in one of three metal layers and having 22 to 32 turns (or windings); and the first receiver coil comprises two spirals connected in series, each spiral being implemented in one of two metal layers and having 30 to 40 turns; and the second receiver coil comprises two spirals connected in series, each spiral being implemented in one of two metal layers and having 30 to 40 turns.

In an embodiment, the proximity sensor device comprises only three coils, namely said first transmitter coil (e.g. Tx1) and said first receiver coil (Rx1) and said second receiver coil (Rx2); and the area between the inner and outer periphery of the first transmitter coil (e.g. Tx1), (also referred to herein as the first ribbon-shaped region ZTx1) amounts to 36% to 44% of the active area; and the area between the inner and outer periphery of the first receiver coil (e.g. Rx1), (also referred to herein as the second ribbon-shaped region ZRx1) amounts to 12% to 18% of the active area; and the area between the inner and outer periphery of the second receiver coil (e.g. Rx2), (also referred to herein as the third ribbon-shaped region ZRx2), amounts to 12% to 18% of the active area.

Thus, in this embodiment, the ribbon-shaped regions (i.e. part of the active surface "under" the coil windings, where no components are placed) together occupy from 60% to 80% of the active area of the semiconductor substrate, meaning there is only 20% to 40% left for placing active/passive components, or bond-pads.

In an embodiment the substrate further comprises a second receiver coil (e.g. Rx2) and a second transmitter coil (e.g. Tx2); wherein the second receiver coil is electrically insulated from the first transmitter coil and from the second transmitter coil, and wherein the second transmitter coil is electrically insulated from the first receiver coil and the second receiver coil; and the second receiver coil has a third spiral course formed in the same layer(s) as the first receiver coil, wherein an orthogonal projection of the third spiral course on the active substrate defines a third inner periphery and a third outer periphery, (also referred to herein as the inner and outer periphery of a third ribbon-shaped region ZRx2); the second transmitter coil has a fourth spiral course formed in the same layer or layers as the first transmitter coil, an orthogonal projection of the fourth spiral course on the active substrate defines a fourth inner periphery and a fourth outer periphery, (also referred to herein as the inner and outer periphery of a fourth ribbon-shaped region ZTx2); wherein the outer periphery of the second transmitter coil is situated completely outside the outer periphery of the first transmitter coil; and wherein the outer periphery of the first receiver coil is situated completely inside the inner periphery of the first transmitter coil; and wherein the outer periphery of the second receiver coil is situated completely inside the inner periphery of the second receiver coil.

Or stated in other words, the second receiver coil defines a third ribbon-shaped region, and the second transmitter coil defines a fourth ribbon-shaped region, and the second ribbon-shaped region ZTx2 is situated completely outside the first ribbon-shaped region ZTx1, and the second ribbon-shaped region ZRx1 is situated completely inside the first ribbon-shaped region ZTx1, and the third ribbon-shaped region ZRx2 is situated completely inside the fourth ribbon-shaped region ZTx2.

Or stated in simple terms, this embodiment has a first receiver coil arranged "inside" a first transmitter coil and has a second receiver coil arranged "inside" a second transmitter coil.

The first transmitter coil and the second transmitter coil may be arranged at a distance from each other, e.g. on opposite sides of the active area, e.g. as illustrated in FIG. 15(a). The area between the two transmitter coils can be used to place active/passive components and/or bond pads. According to the principles of the present invention, at least one active or passive component or bond pad is located inside the inner periphery of the first or second transmitter coil, and/or inside the inner periphery of the first or second receiver coil.

The second transmitter coil may be electrically insulated from the first transmitter coil. Alternatively, the second transmitter coil may be electrically connected in parallel with the first transmitter coil. Alternatively, the second transmitter coil may be electrically connected in series with the first transmitter coil.

In an embodiment, each of the first and second transmitter coil comprises three spirals connected in parallel, the spirals being implemented in three metal layers (e.g. M2, M3, M4) and each having 22 to 32 turns; and each of the first and second receiver coil comprises two spirals connected in series, the spirals being implemented in two or in three metal layers and each having 30 to 40 turns.

Tests have shown that this combination provides a good working solution for the integrated inductive switch.

In an embodiment, the proximity sensor device comprises only four coils (e.g. Tx1, Rx1, Tx2, Rx2) namely a first and second transmitter coil and a first and second receiver coil, and wherein the sum of the area between the inner and outer periphery of the first transmitter coil (also referred to herein as the first ribbon-shaped zone ZTx1) and the area between the inner and outer periphery of the second transmitter coil (also referred to herein as the fourth ribbon-shaped zone ZTx2) amounts to 35% to 45% of the active area; and wherein the sum of the area between the inner and outer periphery of the first receiver coil (also referred to herein as the second ribbon-shaped zone ZRx1) and the area between the inner and outer periphery of the second receiver coil (also referred to herein as the third ribbon-shaped zone ZRx2) amounts to 20% to 28% of the active area; and wherein at least 1% of the combined area inside the inner peripheries of the first and second receiver coils is occupied by one or more active or passive components or bond pads, e.g. by parts of analog circuitry (e.g. an operational amplifier, a comparator, a resistor, a voltage generator, an Analog-to-Digital convertor, a modulator, a demodulator, a buffer, a multiplexer, etc.), and/or parts of digital circuitry (e.g. digital memory, a digital processor, a counter, a shift-register, etc.).

Thus, in this embodiment, the ribbon-shaped regions (i.e. part of the active surface "under" or "below" the coil windings, where no components are placed) together occupy from 55% to 73% of the active area of the semiconductor substrate. It is an advantage, however, that at least a portion of the areas inside one or more of the ribbon-shaped regions is advantageously used for locating components, which would otherwise have to be located "outside of the coils".

In preferred embodiments, preferably at least 2%, or at least 5%, or at least 10%, or at least 15%, or at least 20%, or at least 25%, or at least 30%, or at least 40%, or at least 50%, or at least 60%, or at least 70% of the area inside the inner periphery of the first receiver coil is occupied by one or more active or passive components or by bond pads, e.g. by parts of analog circuitry, and/or parts of digital circuitry, e.g. by a capacitor array.

In an embodiment, the first transmitter coil comprises a stack of at least two spiral windings formed on top of each other, one spiral in each layer of said first subset of metal layers; wherein adjacent spirals are interconnected by means of a plurality of vias which are spaced apart by less than 100 micron, preferably less than 50 micron, or less than 20 micron, or less than 10 micron, or less than 5 micron, e.g. of about 4 micron, or about 3 micron, or about 2 micron.

It is a major advantage of forming the first coil in this way, because on the one hand, by connecting the spirals formed in the different metal layers in parallel (e.g. on top of each other), the series resistance of the coil is reduced, and on the other hand, at least equally important, by interconnecting the spirals not only at their start and end points (e.g. at an innermost location and an outermost location), but by interconnecting them by means of a plurality of vias distributed over their entire path, the parasitic capacity between the different spirals is dramatically reduced. This is especially true if the spiral windings of the first transmitter coil are implemented in metal layers having a different thickness.

The target has a predefined shape and size.

In an embodiment, the target comprises a ferro-magnetic material.

In an embodiment, the target comprises ferro-magnetic particles, e.g. embedded in a matrix material, e.g. in an electrically isolating matrix material, e.g. a resin or a ceramic. What is important in this embodiment is the magnetic properties of the material, not the electrical properties.

In another embodiment, the metal target does not comprise a ferro-magnetic material. What is important in this embodiment is not its magnetic properties, but its electrical properties. The target should be electrically conductive over at least a portion thereof, for allowing eddy currents to flow, when brought in the vicinity of an alternating magnetic field.

In an embodiment, the substrate comprises silicon, and the monolithic integrated inductive switch is fabricated in accordance with a CMOS process, preferably using a lithography of 1 µm or smaller, e.g. 350 nm, or 180 nm, or 110 nm, or 90 nm.

In an embodiment, each of the turns of the first transmitter coil has a substantially equal rectangular cross section, each having a predefined height (in a direction perpendicular to the semiconductor substrate) and a predefined width (parallel to the semiconductor substrate); and a ratio between a sum of said heights (as the nominator) and an average of said widths (as the denominator) is smaller than 1.

Or expressed mathematically, preferably $N*\Sigma(Hi)/\Sigma(Wi) < 1$, where Hi is the height, and Wi is the width of the metal track of metal layer #i, and N is the number of metal layers used by the transmitter coil. For example, if the number of metal layers is N, and if all the heights are equal to H, and if all the widths are equal to W, this can be written as: (N*H/W) is preferably smaller than 1.0.

According to a second aspect, the present invention also provides a proximity sensor system comprising: a proximity sensor device according to the first aspect; and an electrically conductive target movable along a predefined trajectory relative to the proximity sensor device between a first position and a second position.

In an embodiment, the target is movable in a predefined direction parallel to the semiconductor substrate; and an amount of overlap between a projection of the target and the inner periphery of the at least one receiver coil is different when the target is in its first position or in its second position; and the evaluation circuit is configured for determining whether the target is in its first or second position depending on the amount of overlap.

In case the inductive switch has only a single receiver coil, the evaluation circuit may be configured for comparing the received signal or a signal derived therefrom (e.g. after demodulation) with one or more threshold levels, in order to determine the position of the target.

In case the inductive switch has two receiver coils, the evaluation circuit may be configured for comparing the received signals or signals derived therefrom (e.g. after demodulation) with each other, and determine the position of the target based on the outcome of the comparison.

In case the inductive switch has two receiver coils, the evaluation circuit may be configured for combining the two received signals, and for comparing the combined signal or signal derived therefrom (e.g. after demodulation) with one or more threshold levels, in order to determine the position of the target (e.g. metal target or magnetic target).

In an embodiment, the proximity sensor system comprises at least two monolithic integrated proximity sensor devices according to the first aspect, and a target movable relative to said at least two proximity sensor devices. The system may further comprise a controller connected to the at least two proximity sensor devices and may be configured for determining a position of the target relative to said proximity sensor devices based on the signals provided by said devices.

In an embodiment, the proximity sensor device is configured for determining and optionally outputting whether the target (e.g. metal target or magnetic target) is in its first position or in its second position.

In an embodiment, the proximity sensor device comprises a semiconductor substrate, and the predefined trajectory is substantially parallel to said semiconductor substrate and is located at a predefined distance (g) from said semiconductor substrate.

In preferred embodiments, a ratio of a total area of said semiconductor substrate including the first transmitter coil and the first receiver coil (expressed in square mm) and said predefined distance (expressed in mm) is smaller than 2.75, or smaller than 2.5, or smaller than 2.25, or smaller than 2.0, or smaller than 1.75, or smaller than 1.50, or smaller than 1.25, e.g. is equal to about 1.

It is a major advantage of embodiments of the present invention wherein the area of the semiconductor substrate is only a factor of 1.0 to 5.0 times larger than the distance between the target and the semiconductor substrate, because such a sensor device is more compact and more cost effective. This is a major difference with the prior art, where the ratio between sensor dimension and air gap is typically in the order of 3 to 6.

According to a third aspect, the present invention also provides a seatbelt buckle comprising a monolithic integrated proximity sensor device according to the first aspect.

According to a fourth aspect, the present invention also provides an integrated circuit comprising: a semiconductor substrate; an interconnection stack comprising a plurality of metal layers on top of the semiconductor substrate; a coil arrangement comprising a transmitter coil (e.g. TX) and a receiver coil (e.g. RX), both implemented in one or more layers of the interconnection stack, each of the transmitter coil and the receiver coil comprising at least one spiral, each spiral comprising at least three windings; where an orthogonal projection of the receiver coil is located completely inside an orthogonal projection of the transmitter coil; and wherein an orthogonal projection of the transmitter coil has a symmetry axis and has one or more cross-over junctions situated on that symmetry axis.

An example of such a transmitter coil is illustrated in FIG. 19.

In an embodiment, an orthogonal projection of the receiver coil has a symmetry axis and has one or more cross-over junctions situated on that symmetry axis.

In an embodiment, a start point (e.g. c1) and an end point (e.g. c2) of the transmitter coil are situated at an outer periphery of the transmitter coil; and a start point (e.g. c3) and an end point (e.g. c4) of the receiver coil are situated at an inner periphery of the receiver coil.

An example of such a transmitter coil and a receiver coil is illustrated in FIG. 19.

According to a fifth aspect, the present invention also provides an integrated transformer comprising an integrated circuit according to the fourth aspect.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 3A:
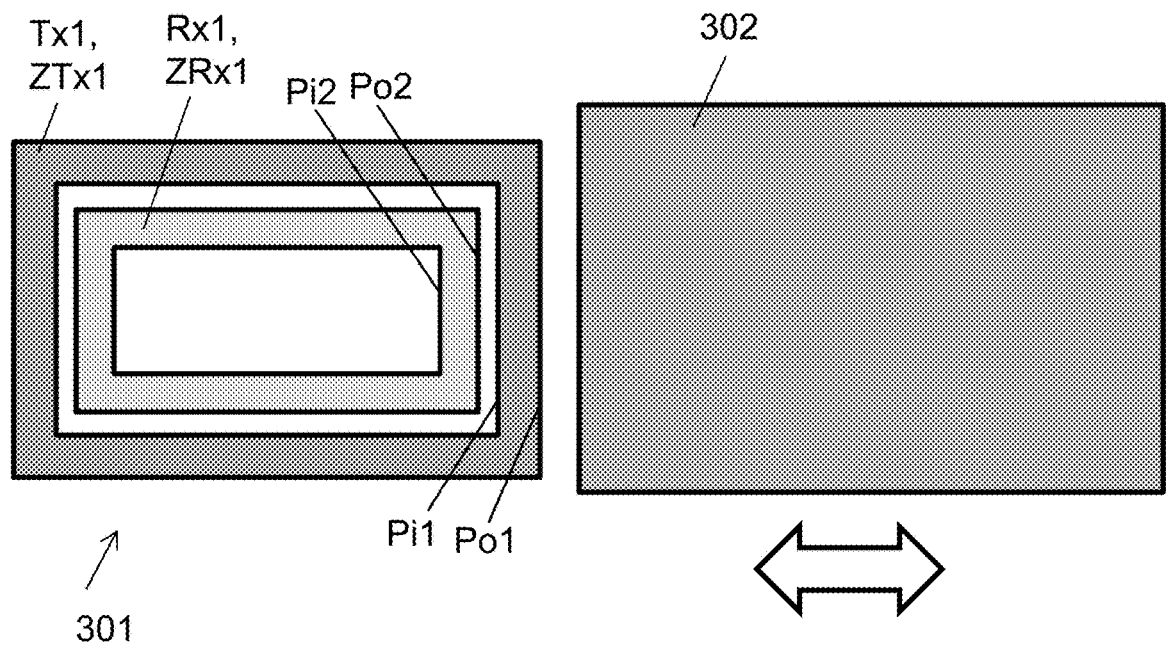
FIGS. 3(a)-3(b), 4(a)-4(c), 5(a)-5(b), 6(a)-6(b) and 7(a)-7(c) shows several examples of arrangements of a proximity sensor device according to embodiments of the present invention comprising one or more transmitter coil and one or more receiver coil integrated in a monolithic device, and a conductive target in a first and a second position relative to said coils.
Figure 3B:
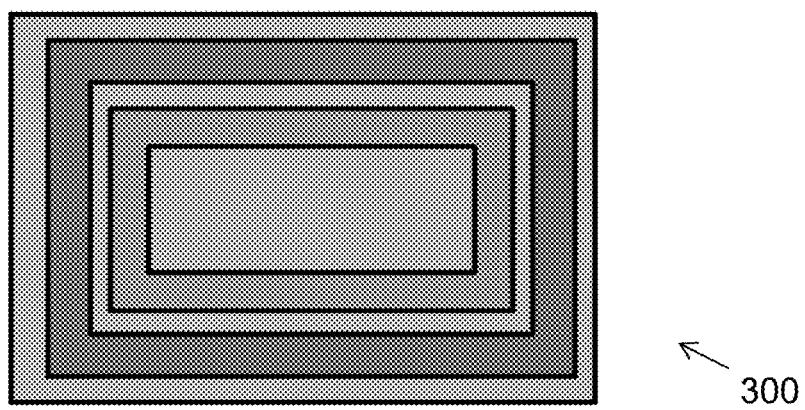

In the example of FIG. 3(a) and FIG. 3(b) the device has only a single transmitter coil and a single receiver coil.

In the examples of FIG. 4(a) to FIG. 6(b) the device has a single transmitter coil and two receiver coils.

Figure 7A:
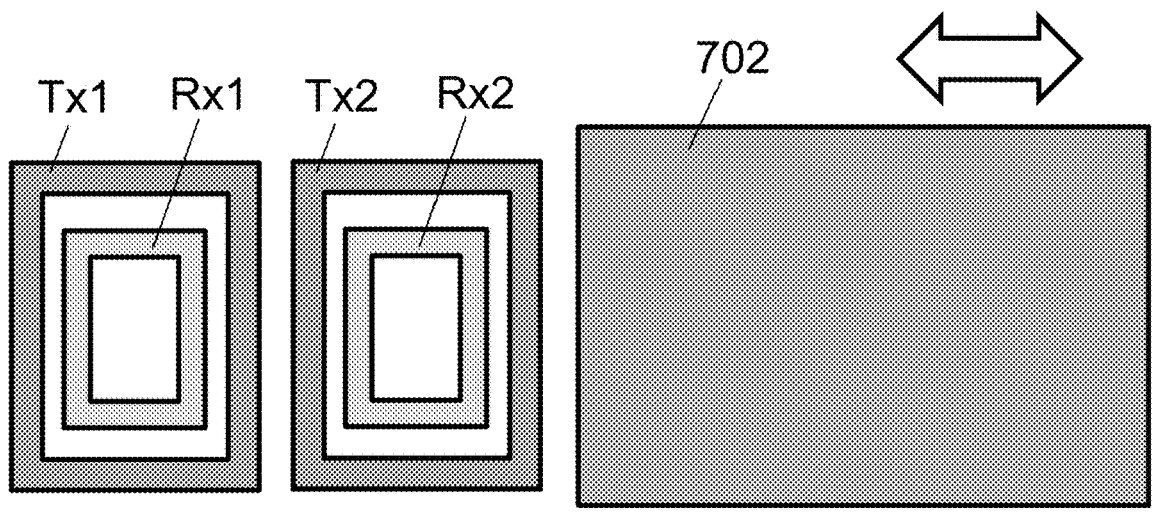
Figure 7B:
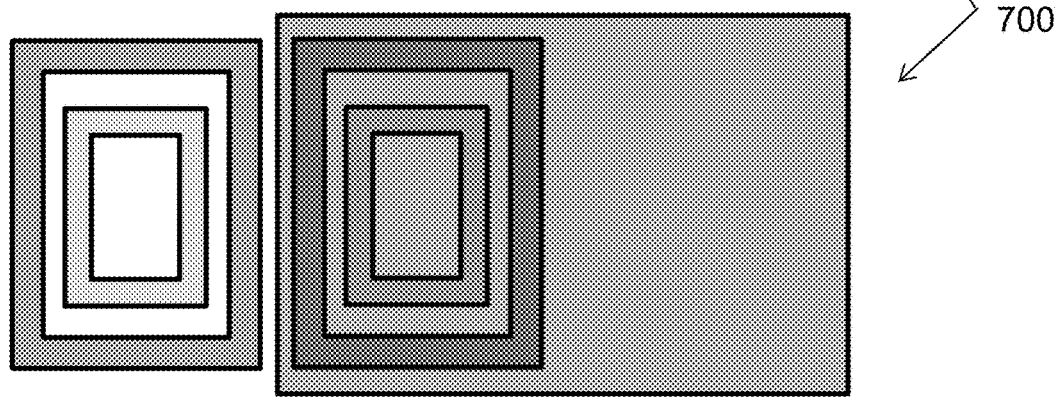
Figure 7C:
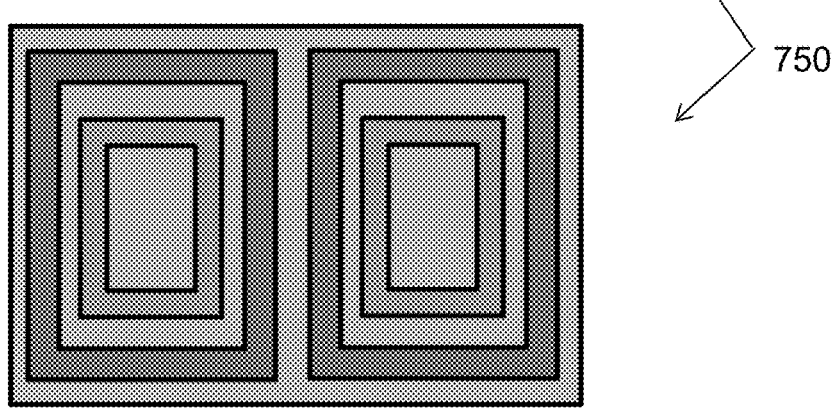

In the examples of FIG. 7(a) to FIG. 7(c) the device has two transmitter coils and two receiver coils.

FIG. 8(a) to FIG. 8(d) illustrate schematically how the at least one transmitter coil may be implemented in certain embodiments of the present invention.

FIG. 9(a) to FIG. 9(d) illustrate schematically how the at least one receiver coil may be implemented in certain embodiments of the present invention.

Figure 10A:
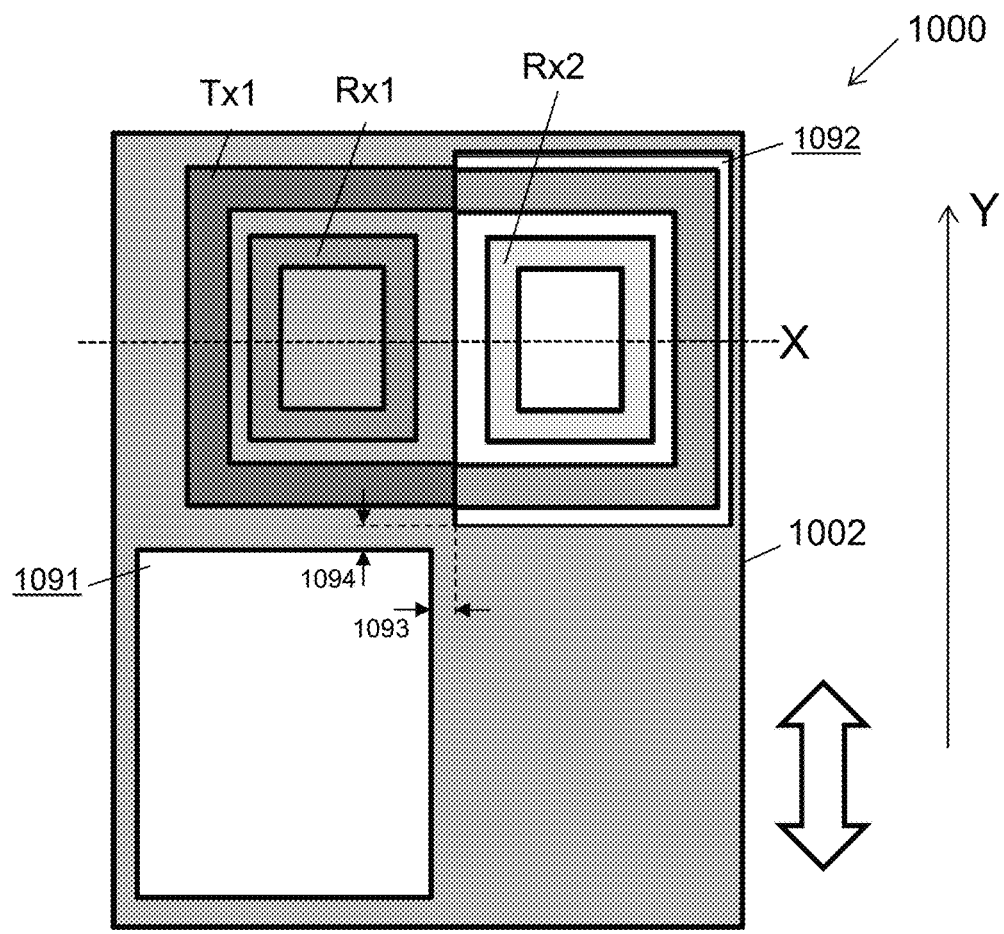

FIG. 10(a) shows another arrangement of a proximity sensor system according to an embodiment of the present invention, wherein the proximity sensor device comprises one transmitter coil and two receiver coils, and a target (e.g. metal target or magnetic target) having two openings and being movable parallel to the sensor device in a direction transverse to the receiver coils.

Figure 10B:
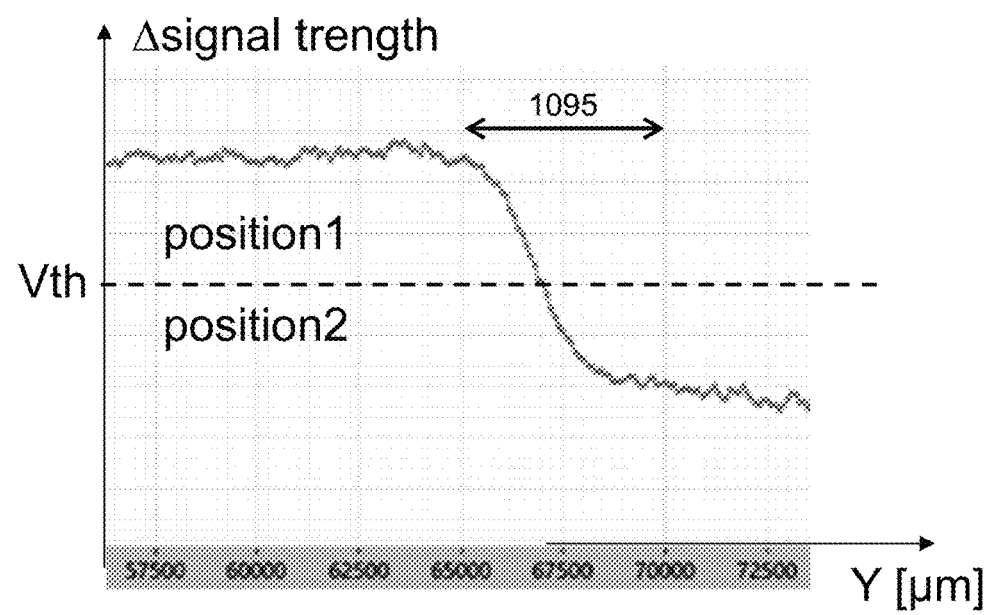

FIG. 10(b) shows measurement results of the proximity sensor system of FIG. 10(a) and shows how a single threshold voltage may be used by the sensor device to determine the position of the target.

Figure 10C:
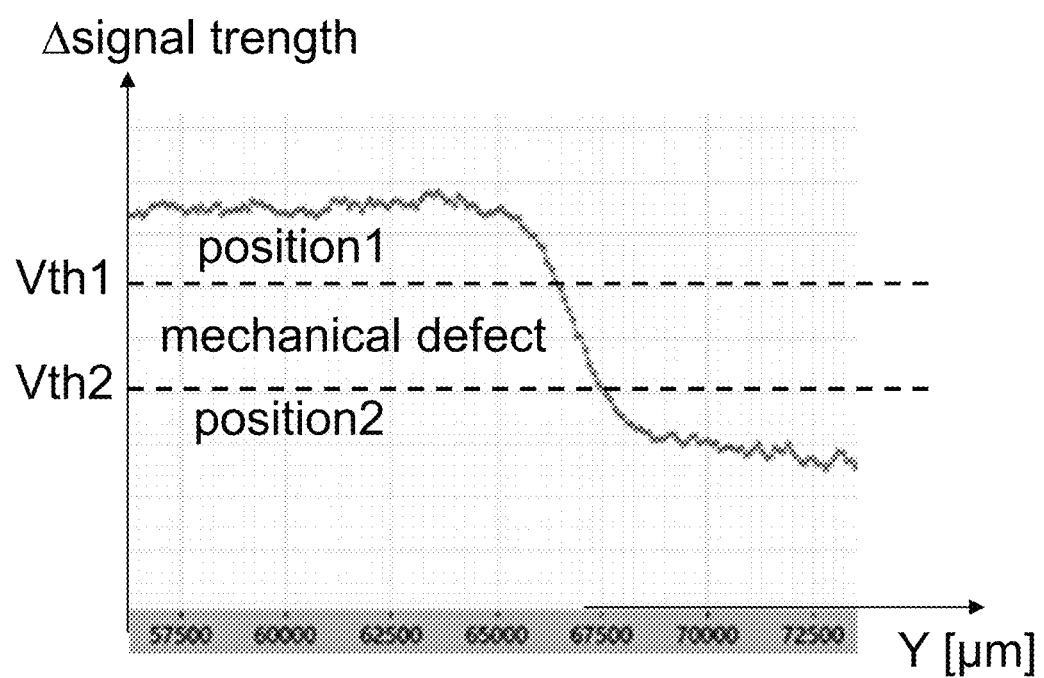

FIG. 10(c) shows measurement results of the proximity sensor system of FIG. 10(a), and shows how two or more threshold voltages may be used by the sensor device to determine a position of the target, and/or to detect a mechanical problem.

Figure 10D:
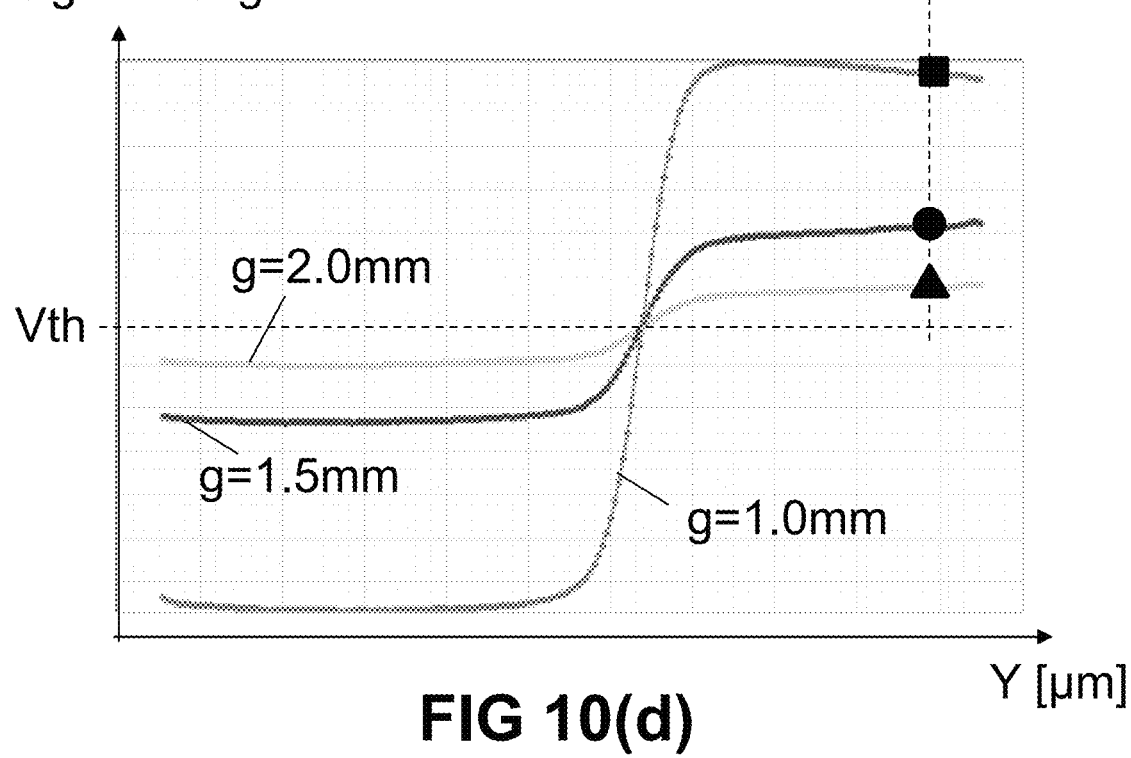

FIG. 10(d) show measurement results for another proximity sensor system, when the target is moved parallel to the semiconductor device.

Figure 10E:
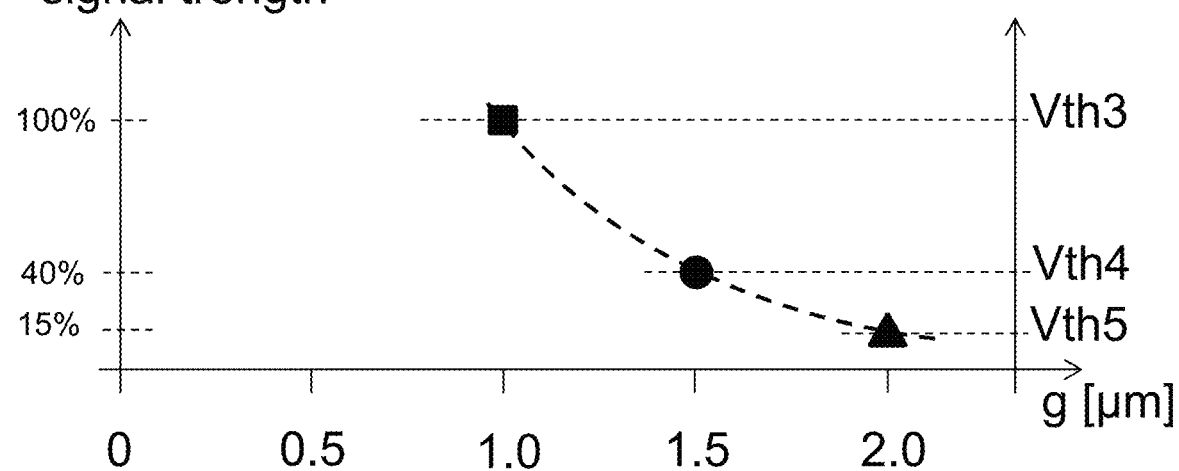

FIG. 10(e) is another representation of the data of FIG. 10(d) illustrating which signal would be measured if the target moves in a direction perpendicular to the sensor device.

Figure 11A:
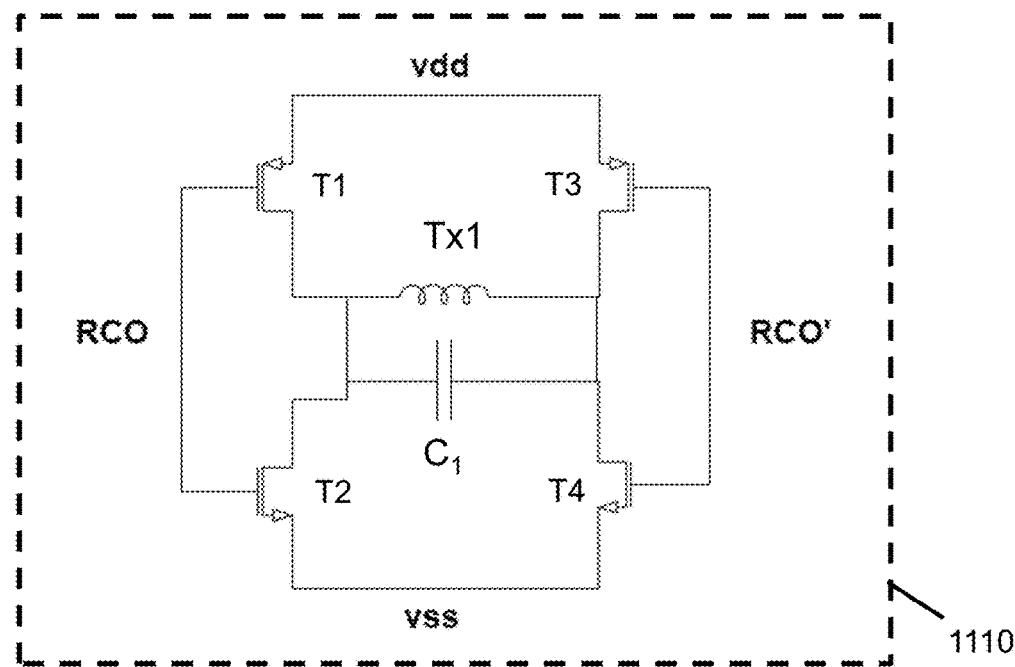
Figure 11B:
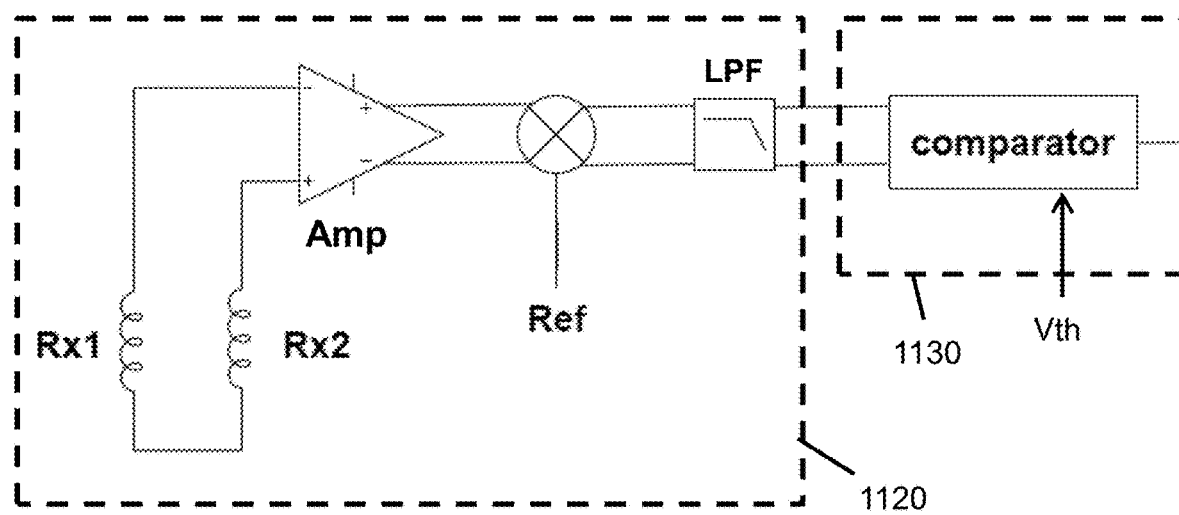

FIG. 11(a) shows a schematic block diagram of an exemplary transmitter circuit, and FIG. 11(b) shows a schematic block diagram of an exemplary receiver circuit which can be used in embodiments of the present invention.

Figure 12A:
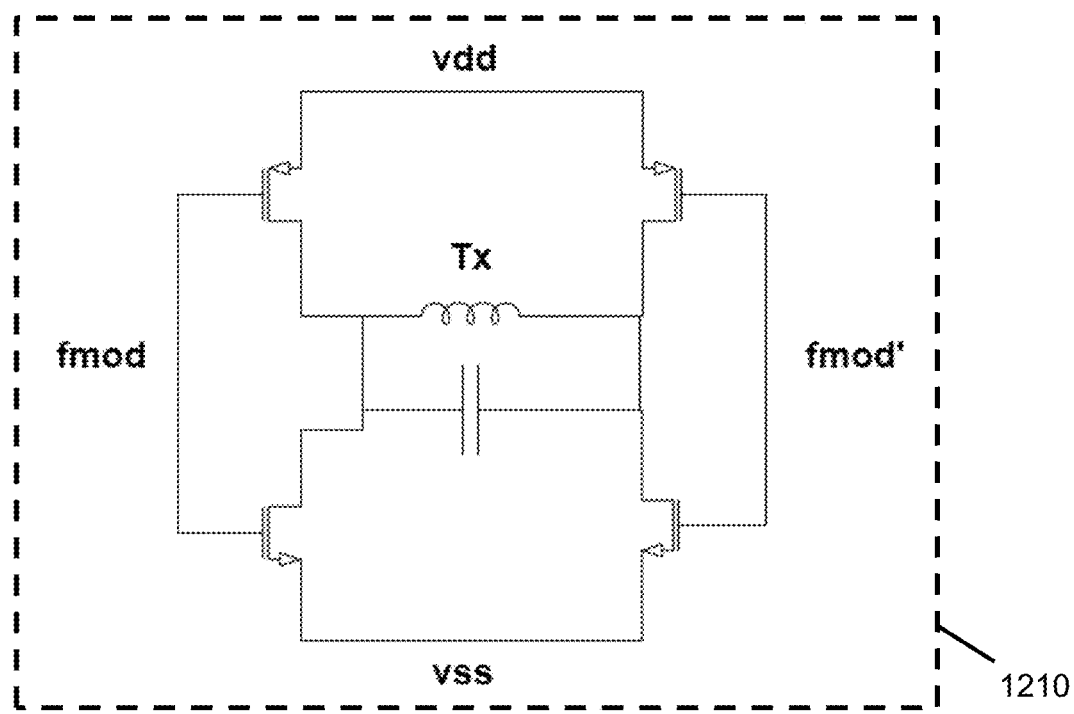
Figure 12B:
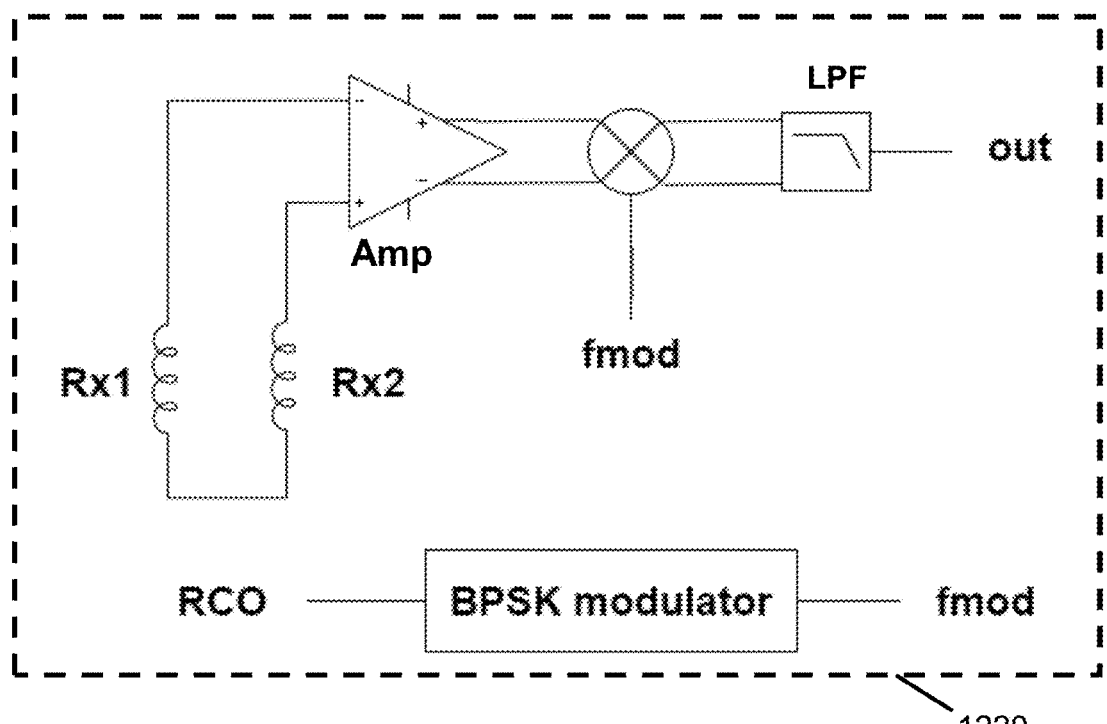

FIG. 12(a) shows a schematic block diagram of another exemplary transmitter circuit, and FIG. 12(b) shows a schematic block diagram of an exemplary receiver circuit which can be used in embodiments of the present invention.

FIG. 13(a) to FIG. 13(c) show examples of possible layouts, as can be used in embodiments of the present invention where the device comprises a single transmitter coil and two receiver coils.

FIG. 13(*a*) gives a rough impression of how much silicon area would be required if all active and passive components and bond pads are located outside the area defined by the transmit and receiver coil(s).

FIG. 13(*b*) gives an impression of how much silicon area would be required if the circuitry is moved inside the area defined by the transmit coil but outside of the area defined by the receiver coil(s).

FIG. 13(*c*) gives an impression of how much silicon area would be required and how much silicon area is still available for other circuitry if part of the circuitry is moved inside the area defined by the receive coil(s).

FIG. 14(*a*) to FIG. 14(*c*) is a schematic representation corresponding to the layouts of FIG. 13(*a*) to FIG. 13(*c*), to give an impression of the geometrical size of the individual areas. FIG. 14(*c*) is shown in a more compact way than FIG. 13(*c*).

Figure 15A:
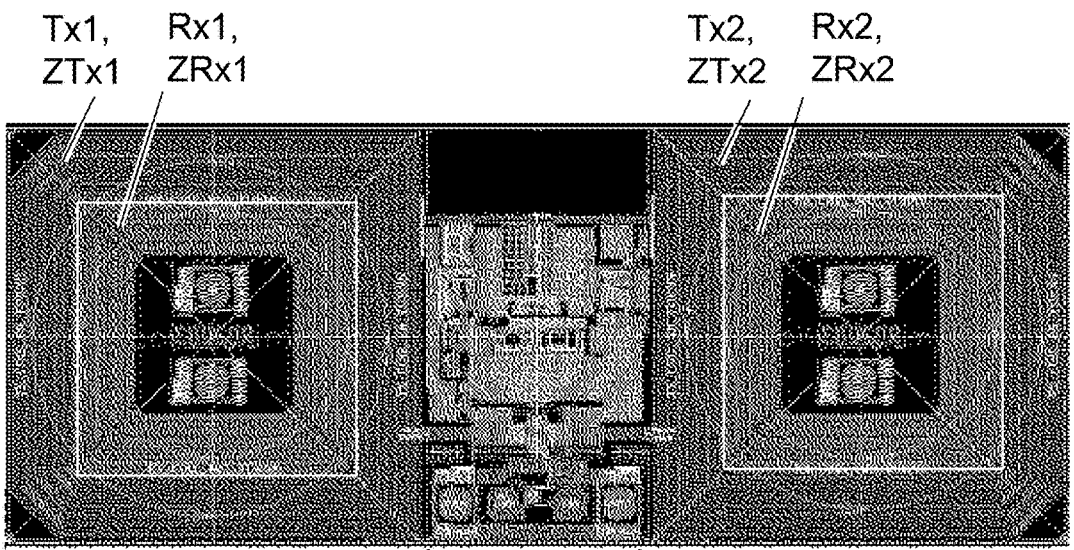
Figure 15B:
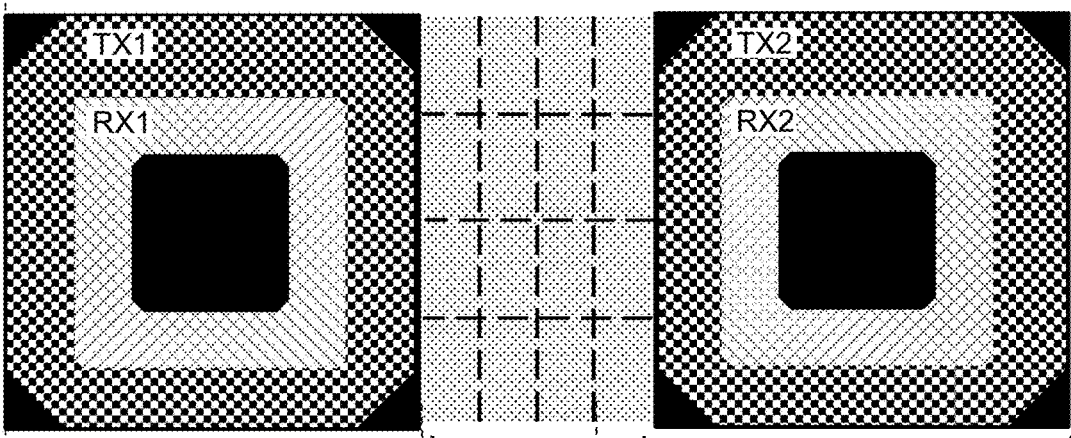
Figure 15C:
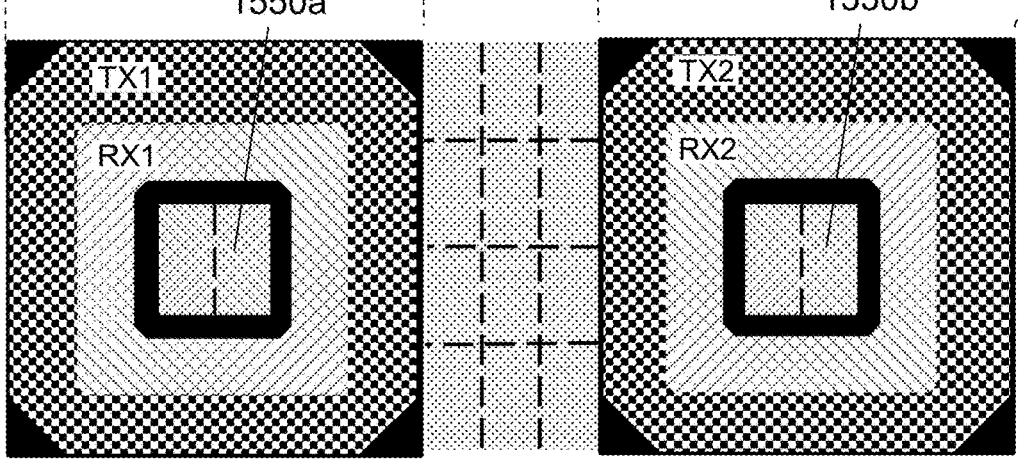

FIG. 15(*a*) shows an example of a possible layout, as can be used in embodiments of the present invention, where the sensor device comprises two transmitter coils and two receiver coils. FIG. 15(*b*) gives a rough impression of how much area would be required if all active and passive components and bond pads would be located outside of the area defined by the transmitter and receiver coil(s).

FIG. 15(*c*) gives an impression if some of the circuitry is moved inside the area defined by the receiver coil(s).

Figure 16:
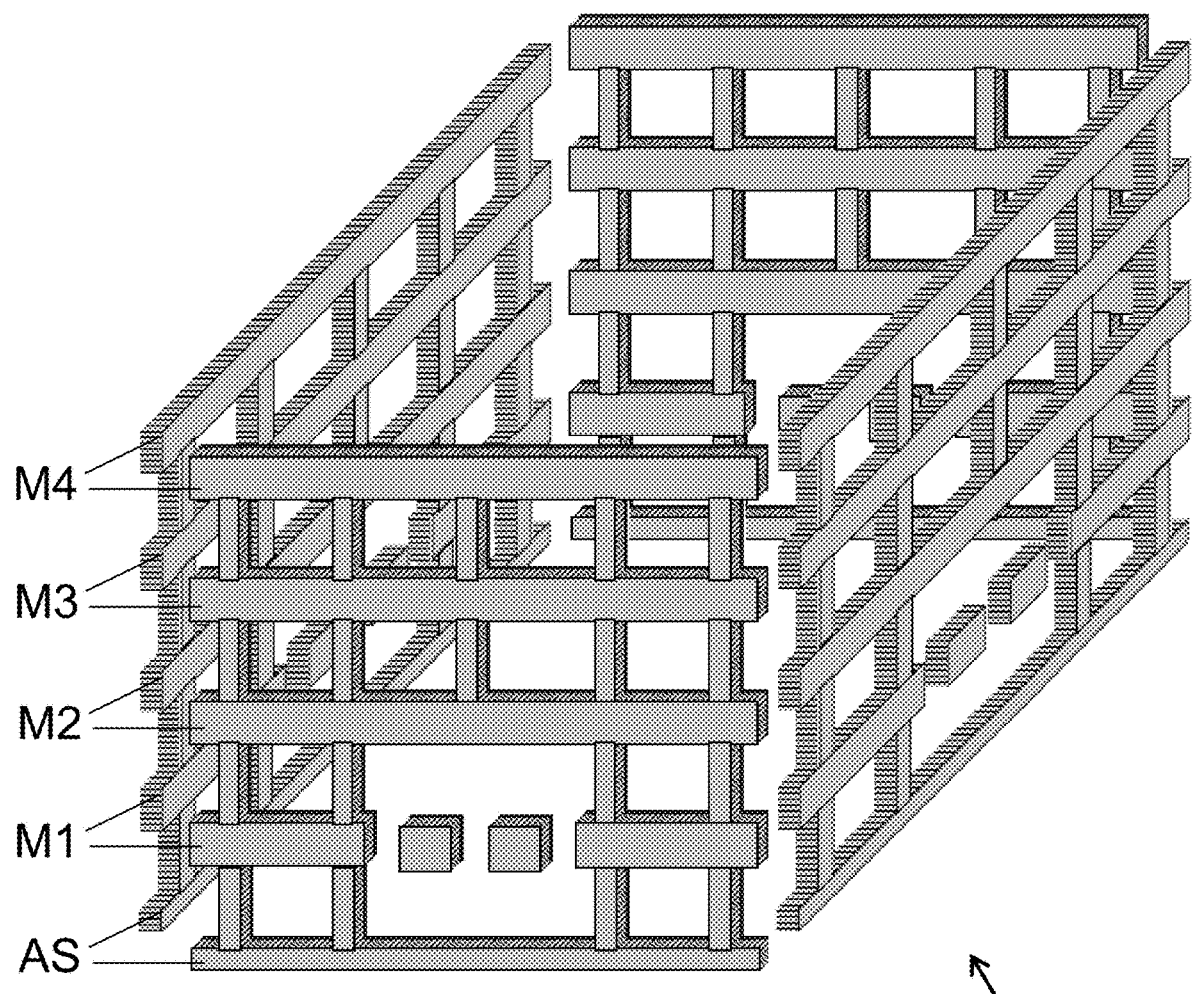
Figure 17A:
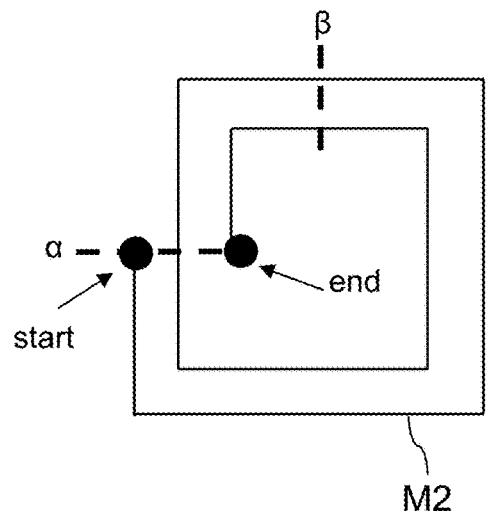
Figure 17B:
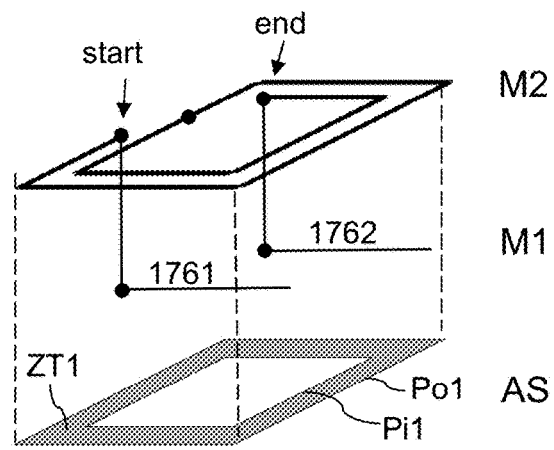
Figure 17C:
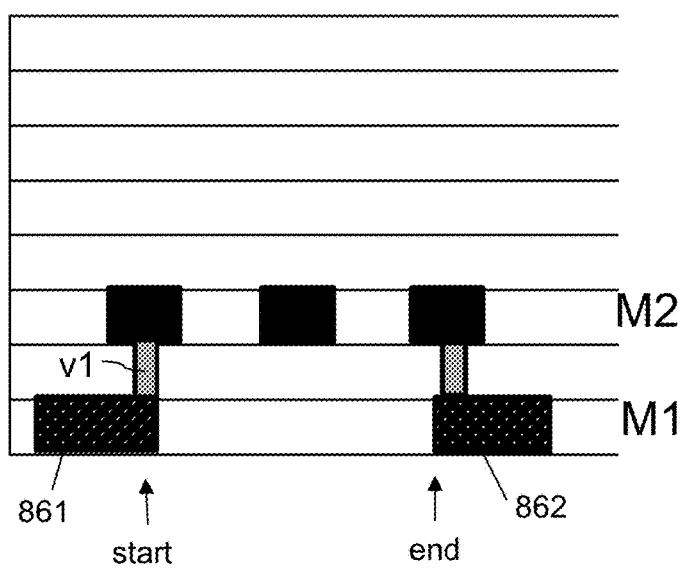
Figure 17D:

FIG. 16 shows an example of a metal shielding as may be arranged for example between the windings of the transmitter coil and the receiver coil(s).

FIG. 17(*a*) to FIG. 17(*d*) schematically illustrate how a single transmitter coil may be implemented in a single metal layer, as may be implemented in embodiments of the present invention.

FIG. 18(*a*) to FIG. 18(*d*) schematically illustrate how a single receiver coil may be implemented in a single metal layer, as may be implemented in embodiments of the present invention.

Figure 19:
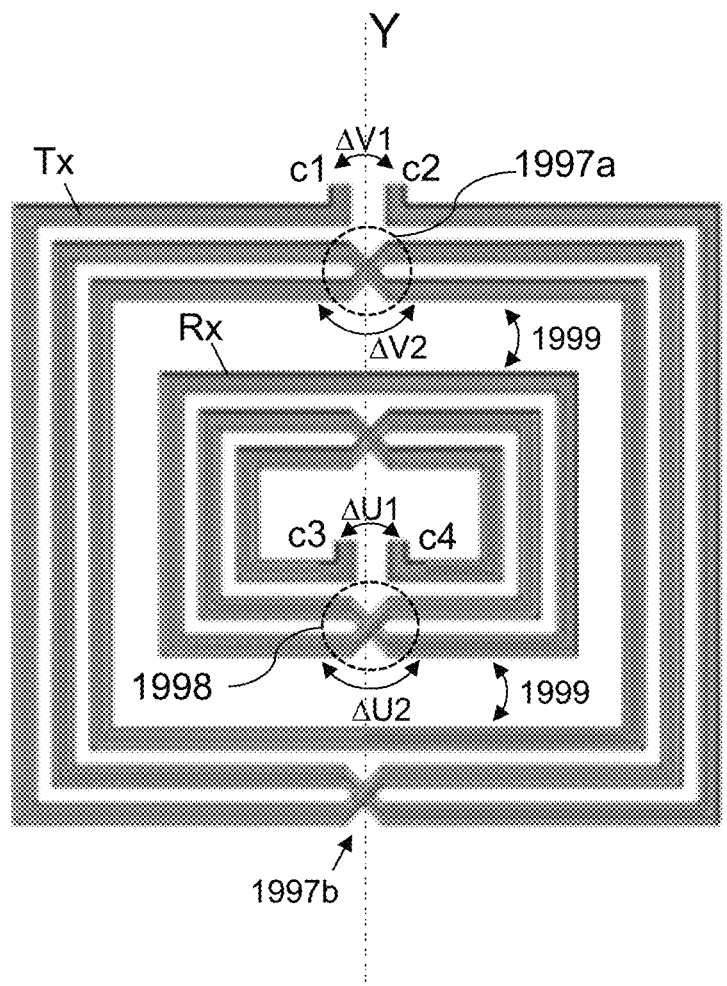

FIG. 19 shows an integrated circuit comprising a transmitter coil having a symmetry axis and having one or more cross-over junctions situated on that symmetry-axis.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the expression "monolithic circuit" means: an integrated circuit in the form of a single semiconductor die.

With "inner periphery of a 2D spiral" is meant the periphery of the largest possible concave polygon that fits inside the spiral.

With "inner periphery of a 3D spiral" is meant the periphery of the largest possible concave polygon that fits inside an orthogonal projection of the spiral on the semiconductor substrate.

With "outer periphery of a 2D spiral" is meant the periphery of the smallest possible concave polygon that fits around the spiral.

With "outer periphery of a 3D spiral" is meant the periphery of the smallest possible concave polygon that fits around an orthogonal projection of the spiral on the semiconductor substrate.

In this document, the terms "transmit circuit" and "transmitter circuit" and "excitation circuit" mean the same.

In this document, the terms "transmit coil" and "transmitter coil" and "excitation coil" and "TX coil" mean the same.

In this document, the terms "receiver circuit" and "reception circuit" mean the same.

In this document, the terms "receiver coil" and "reception coil" and "RX coil" mean the same.

In this document, the terms "periphery" or "circumference" mean the same.

In this document, the statement "the receiver coil is located inside the transmitter coil", what is meant is that an orthogonal projection of the receiver coil is located inside an orthogonal projection of the transmitter coil, unless it is clear from the context that something else is meant.

The present invention relates to "inductive proximity sensor devices" for detecting whether or not an electrically conductive target (e.g. a metal object or a printed circuit board with a conductive layer or a printed circuit board with conductive paths, etc.), further referred to herein as "metal target", or a "magnetic target" (e.g. a target composed of or comprising ferro-magnetic particles), both of which are referred to as "target" for ease of the description, is in the vicinity of the sensor device, or, when used in a proximity sensor system wherein the target is movable on a predefined trajectory between a first position and a second position, for determining whether said target is in its first predefined position or in its second predefined position, and optionally also for detecting whether said target is not in its first or second position for a period longer than a predefined period, for example to detect mechanical failure.

In preferred embodiments of the present invention, the proximity sensor device is capable of reliably detecting the presence of a target (e.g. metal target or magnetic target) up to a predefined distance (or air gap) from the proximity sensor device. The predefined distance may be 0.5 mm, or 1.0 mm, or 1.5 mm, or 2.0 mm, or 2.5 mm, or 3.0 mm. In known systems, this requires coils having a diameter of at least three times this distance, thus coils having a diameter of at least 9 mm. In the prior art, such coils are therefore typically implemented on a printed circuit board (PCB).

The inventors of the present invention took a radically different approach and succeeded in implementing the proximity sensor on a single, monolithic integrated semiconductor substrate, moreover, using a standard CMOS process of a moderate size. Many prejudices, challenges and uncertainties had to be overcome, for example:

in order to decrease the size of the substrate, they decided to implement the transmitter coil(s) and the receiver coil(s) in the interconnection layers (sometimes also referred to as "interconnection stack" or "the metal layers"), assuming four metal layers are available, as is the case for example in some CMOS processes, and they decided to implement the receiver coils "within" the transmitter coils;

in order to create (a) transmitter/receiver coil(s) with a relatively high inductance value (L), (e.g. in the order of 1 to 10 nH), spirals with multiple turns (or windings) were implemented;

in order to create a transmitter coil with a relatively low series resistance, the transmitter coil may comprise at least two spirals, each implemented in a respective metal layer, and these spirals may be connected in parallel;

in order to increase the inductance (L) of the receiver coil(s), the receiver coil(s) may comprise at least two spirals, each implemented in a respective metal layer. These spirals may be connected in series (increasing the number of windings, hence increasing the inductance but also increasing electrical resistance) or may be connected in parallel (yielding a larger cross section, thus decreasing the resistance, without increasing the number of windings);

preferably an integrated capacitor is connected in series or in parallel with the transmitter coil to create a resonant circuit (known as "LC tank" or "LC resonator") with a well-defined and relatively stable resonance frequency which does not significantly vary with temperature (in contrast to parasitic capacitors);

The inventors also decided to use a forced oscillation of the LC tank, by applying an excitation voltage or current at a frequency lower than the resonance frequency of the LC resonator, rather than allowing the LC tank to oscillate at its resonance frequency, to reduce the risk of instability.

It is impossible to predict what the overall performance of such a transmitter and receiver circuit will be, especially with respect to capacitive coupling (e.g. capacitive coupling between winding portions of a given coil, or capacitive coupling between an RX coil and a TX coil).

The inventors did not know however, whether this circuit would work, let alone, how well it would work. But the inventors went even further, and they performed several experiments in order to further decrease the size of the substrate, by building test-chips in which they moved certain components, e.g. active components such as transistors, and/or passive components such as resistors or capacitors or a capacitor array, and/or bond pads into the central region under the transmitter coil and/or receiver coil, not knowing if the alternating magnetic field would significantly/noticeably disturb the functionality of the analog and/or digital circuitry, or vice versa.

By doing these experiments, they also discovered that merely connecting the spirals of the transmitter coil "in parallel" (e.g. at their start point and at their end point) works, but is not ideal. More specifically, they discovered that by additionally interconnecting the tracks of spirals located on top of each other by means of a plurality of vias, the performance can be further improved. While the exact reason for this improvement is not fully understood, and while the inventors do not wish to be bound by any theory, it is believed that the improvement may be related to the fact that the vias "short" the parasitic capacitance between metal track portions located above each other, which, in theory (if the widths and thicknesses of the various metal track portions are exactly the same) should have exactly the same voltage, but in practice, apparently do not, probably due to process tolerances. In an embodiment wherein the spiral windings of the transmitter coil are implemented in metal layers having different thicknesses, the vias are really advantageous, because the sheet resistance of these different metal layers is really different (not merely because of production tolerances). For example, the fourth metal layer M4, shown e.g. in FIG. 8(c) or FIG. 9(c), although not shown on scale, is typically thicker than any of the other three metal layers M1 to M3.

The inventors also experimented by adding one or more "metal shield(s)" between the transmitter coil and the receiver coil, by implementing a stack of tracks on top of each other in at least two of the metal layers, preferably in the three upper metal layers (M2, M3, M4) and by interconnecting these tracks vertically by means of a plurality of vias. A perpendicular projection of these tracks on the active surface must not form closed loops, in order to avoid eddy currents.

The vias may have a cross section from about 1 µm×1 µm to about 1 µm×10 µm, and may for example be spaced apart over less than 5 µm, e.g. spaced apart over 4 µm, or over 3 µm, or over 2 µm, forming a kind of "metal grid" in the interconnection stack. The "metal shield" may optionally be grounded, or may be connected to a relatively constant voltage (e.g. VDD), or may be left floating.

The metal shield(s) may also comprise tracks implemented in the lowest metal layer M1 (apart from some passages for connecting the transmitter coil), and may even comprise tracks implemented in the active surface (e.g. diffusion layer or polysilicon), also connected by means of vias.

One or more metal shield(s) may also be added between the receiver coil(s) and the space "inside and below the RX windings" in a similar manner, in case one or more active or passive components or bond pads are located there, to shield these windings from the electronics.

One or more metal shield(s) may also be added between the transmitter coil and the space "inside and below the TX windings" in a similar manner, in case one or more active or passive components or bond pads are located there, to shield these windings from the the electronics.

An example of one or more "metal shield(s) as may be arranged between the transmitter coil and the receiver coil(s) is shown in FIG. 16. In this example, the metal shielding is composed of four wall portions. If present, this shield may reduce the capacitive coupling between the windings of the transmitter coil and the receiver coil.

The inventors also experimented using various modulation and demodulation schemes, as will be discussed in relation to FIGS. 11(a) and 11(b) and FIGS. 12(a) and 12(b).

The inventors also experimented with different targets. In some embodiments, the target was made of an electrically conductive metal (e.g. aluminum or copper). The alternating magnetic field induced by the transmitter coil(s) will cause eddy-currents to flow in the target. They also experimented with a target composed of or comprising a ferro-magnetic material or ferro-magnetic particles. The ferromagnetic target may be electrically isolating. The material may be ferrite. The ferromagnetic target may comprise magnetic particles. They surprisingly found that such a target causes magnetic gain. While the inventors do not wish to be bound by any theory, it seems that such a target is capable of concentrating magnetic field lines, such that the Rx coil (or coil portion) which is covered or overlapped by the magnetic target will see a higher flux density or a stronger field than the Rx coil (or coil portion) which is not covered or overlapped by the target.

The result of all these experiments is that the inventors succeeded in making several proximity sensor devices comprising a monolithic integrated semiconductor substrate, all having a size in the range from about 3 to about 4 mm², by using various combinations of one or more features mentioned above. The sensor devices are capable of reliably detecting the presence or the position of the target (e.g. metal target or magnetic target) for an air gap distance up to 2 mm or even up to 3 mm.

Referring now to the Figures.

Figure 1A:
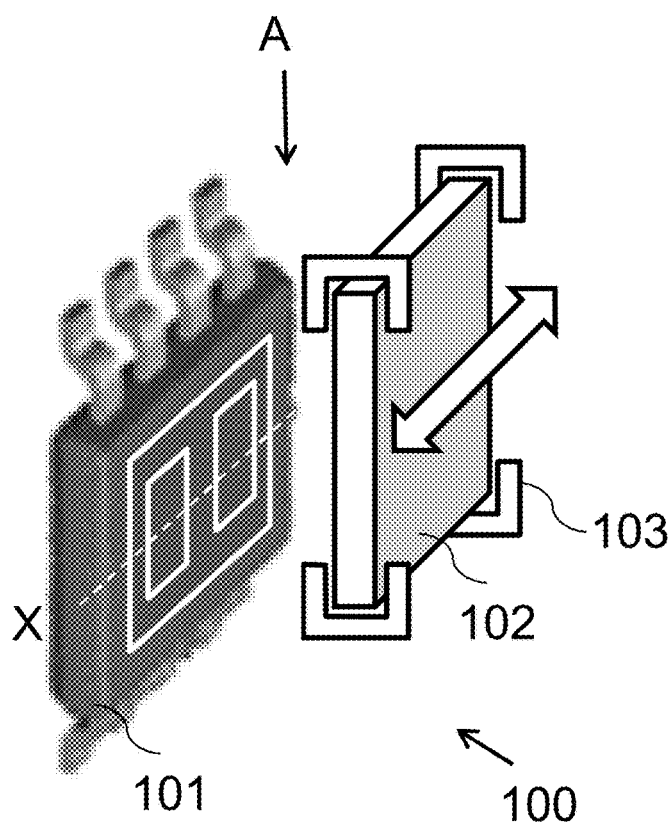
FIG. 1(a) shows a perspective view.
Figure 1B:
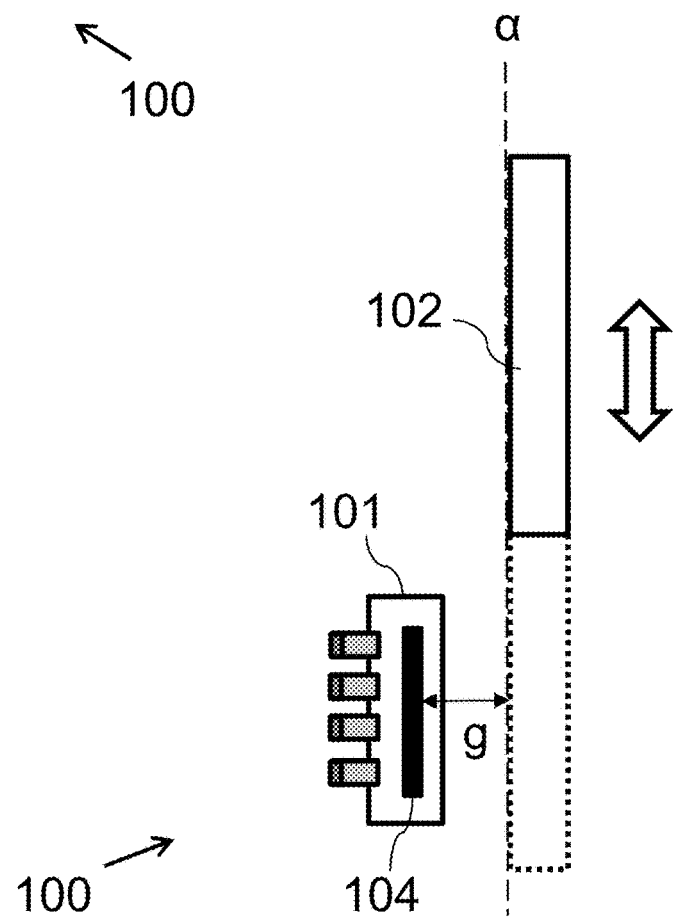
FIG. 1(b) shows a side view of a schematic representation of an exemplary proximity sensor system from viewing point A. The proximity sensor system comprises a proximity sensor device according to embodiments of the present invention, e.g. in the form of a packaged semiconductor device (also known as Integrated Circuit or "chip"), and an electrically conductive target which is movable relative to said device.

FIG. 1(a) shows a perspective view, and FIG. 1(b) shows a side view from viewing point A of a schematic representation of an exemplary proximity sensor system 100 comprising a proximity sensor device 101 (or simply called "sensor device"), and a target 102. The target may be an electrically conductive target (further also referred to as "metal target") or a magnetic target.

The target 102 is movable relative to the sensor device 101 in a virtual plane parallel to the semiconductor substrate of the sensor device 101. In the example of FIG. 1(a), the direction of movement of the target 102 is parallel to a virtual line X passing through the centres of the two receiver coils (shown in dotted line), but that is not absolutely required, see e.g. FIGS. 3(a) and 3(b) having only a single receiver coil, or FIG. 10(a) where the direction of movement of the target 1002 is perpendicular to the virtual line X passing through the centres of the two receiver coils.

The target 102 may be mounted by brackets 103 or other guiding means, and the mounting means of the target may further comprise a spring or the like, but such aspects are not the focus of the present invention, and any mounting arrangement can be used. In order to understand the principles of the present invention it suffices to know that the conductive target 102 is movable between a first predefined position and a second predefined position. Sensor devices 101 according to the present invention only need to be able to differentiate between these two predefined positions, hence the name "inductive switch".

FIG. 1(b) shows that the target 102 may be movable in a virtual plane a located at a distance "g" from the sensor device 101 (also referred to herein as "air gap"). In embodiments of the present invention, this distance "g" can be chosen to be a value in the range from about 0.1 mm to about 3.0 mm, or from 0.1 mm to 2.5 mm, or from 0.1 mm to 2.0 mm, or from 0.1 mm to 1.5 mm, or from 0.1 mm to 1.0 mm. In practice, the target may be mounted preferably at a distance of at least 0.5 mm, to reduce the risk of mechanical contact and thus mechanical wear.

In other embodiments (not shown), the target 102 may be movable towards and away from the proximity sensor device 101 in a direction perpendicular to the substrate 104 of the sensor device 101, or under any other angle between 0° (parallel) and 90° (perpendicular), but the same principles apply.

Figure 2A:
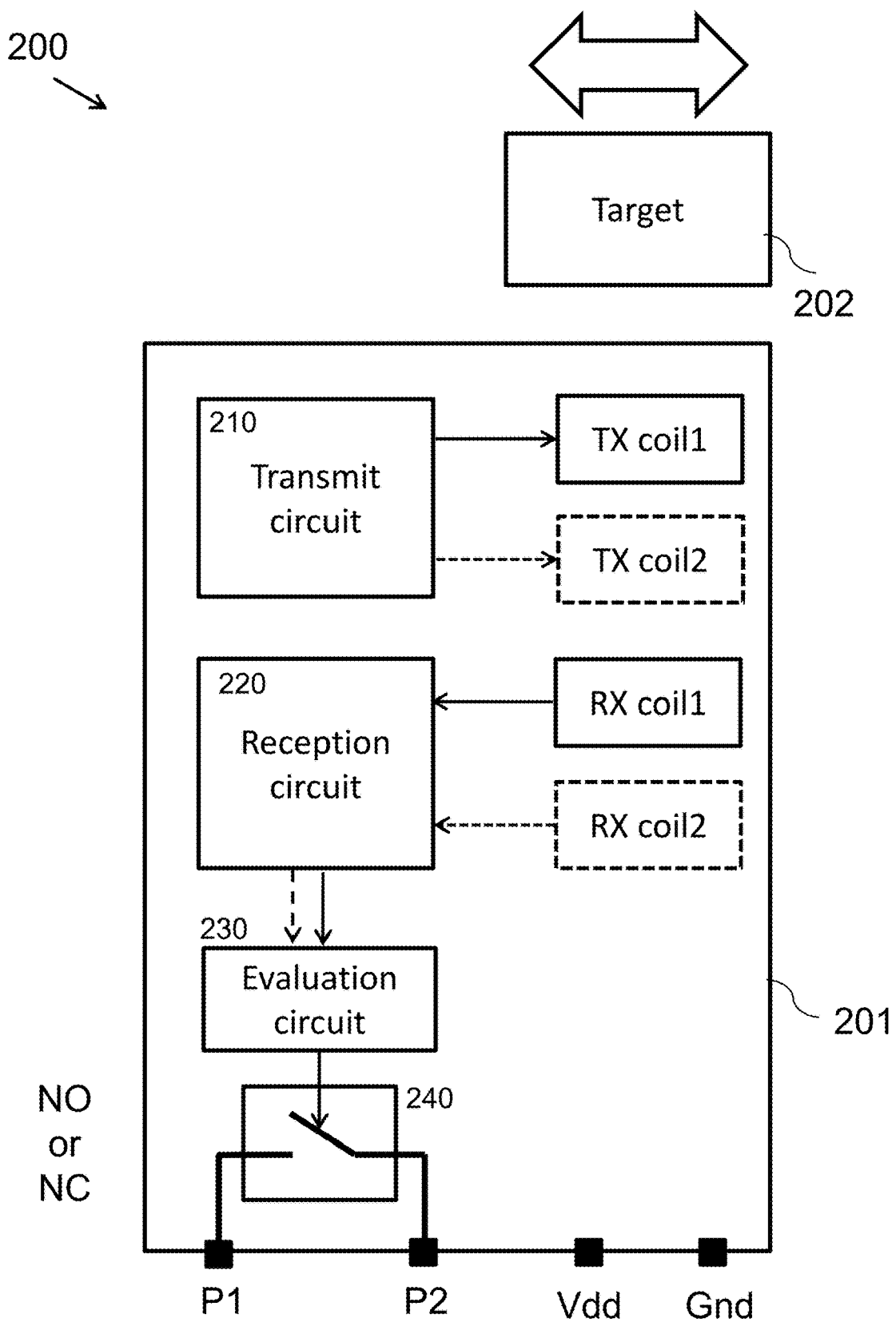
FIG. 2(a) shows an exemplary block diagram of a proximity sensor device according to an embodiment of the present invention, comprising at least one transmitter circuit and transmitter coil, and at least one receiver circuit and receiver coil, and a switch which is opened or closed depending on the detected position of the conductive target.

FIG. 2(a) shows an exemplary block diagram of a proximity sensor system 200 comprising a proximity sensor device 201 and a target 202 (e.g. a metal target or a magnetic target) which is movable relative to the proximity sensor device 201. The sensor device 201 comprises at least one transmitter circuit 210 connected to at least one transmitter coil Tx1. Optionally, the sensor device 201 may further comprise a second transmitter coil Tx2, which may also be connected to the transmitter circuit 210 or may be connected to a second transmitter circuit (not shown). The sensor device 201 comprises at least one receiver circuit 220 connected to at least one receiver coil Rx1. Optionally, the sensor device 201 may further comprise a second receiver coil Rx2, which may also be connected to the receiver circuit 220, or to a second receiver circuit (not shown). The sensor device 201 further comprises an evaluation circuit 230 configured for interpreting the received signal(s) from the at least one reception coil Rx1, Rx2, more in particular for determining whether the target 202 is in its first position or its second position relative to the sensor device.

In the embodiment of FIG. 2(a) the sensor device 201 further comprises a switch 240 (e.g. a "normally closed switch" or a "normally open switch"), which is controlled by the evaluation circuit 230. In an embodiment, the switch 240 will be closed when the target 202 is relatively close to the sensor device 201 and will be opened when the target is relatively far from the sensor device. In another embodiment, the switch 240 will be opened if the target 202 is relatively close to the sensor device 201 and will be closed if the target is relatively far from the sensor device.

These are the most important blocks of the proximity sensor device 201, which will be described in more detail further, but in a practical implementation there may of course also be other blocks and/or components (not explicitly shown), such as for example: an oscillator circuit, clock dividers, phase locked loops (PLL), amplifier(s), comparator(s), modulator, demodulator, analog-to-digital converter (ADC), resistor(s), capacitor(s), diode(s), voltage stabiliser, digital processor, shift registers, a timer, non-volatile memory, serial interface, bond pads, all of which are known in the art, and hence need not be further explained here.

In the present application, the blocks and components including those of the transmit circuit 210, the reception circuit 220, and the evaluation circuit 230 will be subdivided in four categories: coils, active components (e.g. transistors), passive components (e.g. resistors, capacitors), and bond pads, for reasons which will become clear further.

Figure 2B:
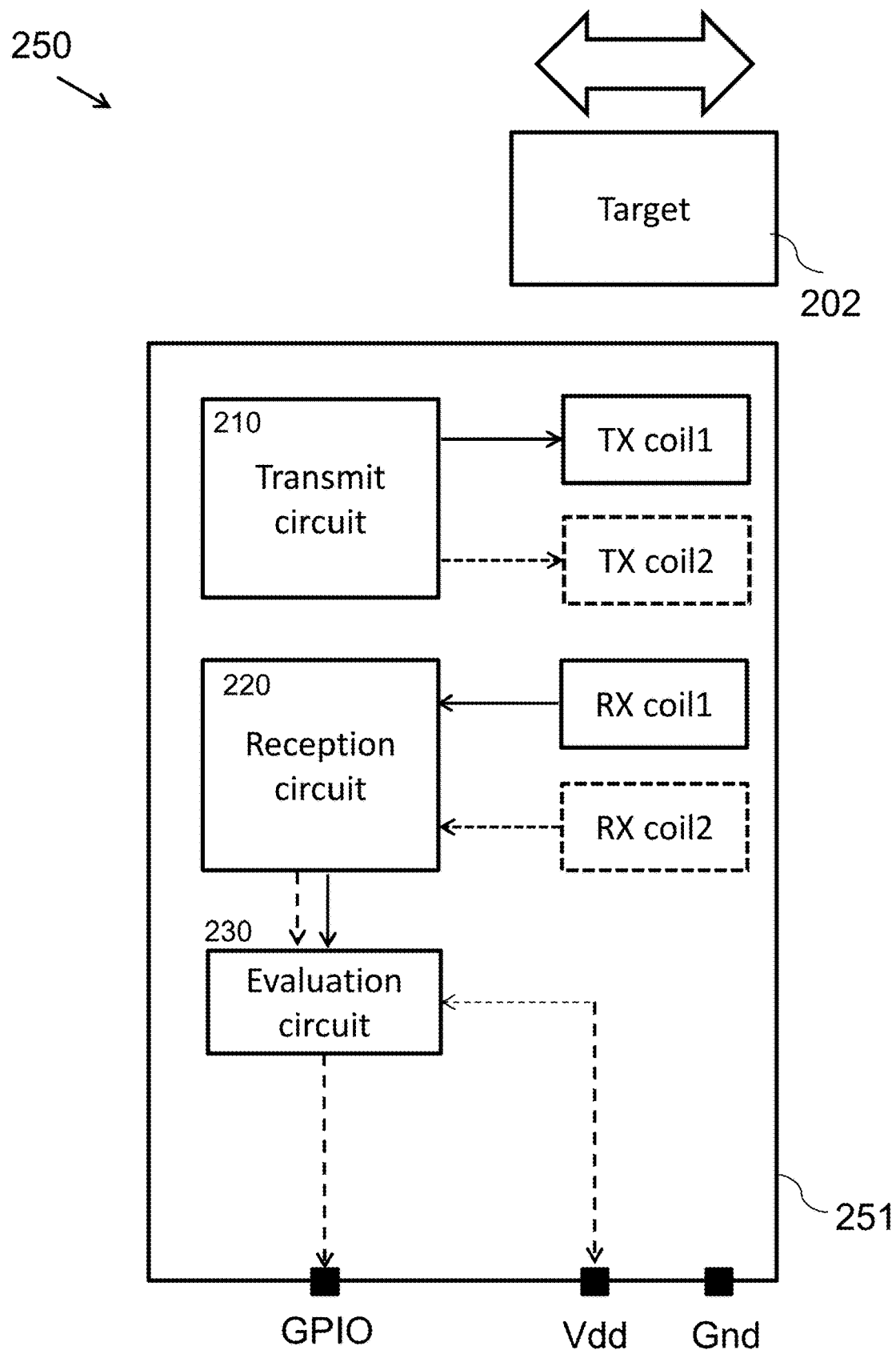
FIG. 2(b) shows another exemplary block diagram of a proximity sensor device according to an embodiment of the present invention, comprising at least one transmitter circuit and transmitter coil, and at least one receiver circuit and receiver coil, and an interface circuit for outputting a value indicative of the detected position of the conductive target.

FIG. 2(b) shows another exemplary block diagram of a proximity sensor system 250, comprising another proximity sensor device 251, and a target 202 which may be identical to the metal target or magnetic target of FIG. 2(a), or may be different.

The proximity sensor device 251 can be regarded as a variant of the proximity sensor device 201 of FIG. 2(a), which does not contain the switch 240, but which provides a value or signal of the evaluation circuit, or a value or signal derived therefrom, to an output, e.g. to a node or a pin of the sensor device 251. Everything else described above for the sensor device 201 of FIG. 2(a) is also applicable for the sensor device 251 of FIG. 2(b). In fact, the sensor device 251 of FIG. 2(b) is typically also referred to as being "an inductive switch", even though it does not have an "internal switch" which provides a low-resistance or high-resistive path between 2 pins as in FIG. 2(a), but outputs a value or signal (e.g. binary value or signal) indicative of the detected position of the target to a general input-output pin GPIO.

The skilled person will understand that FIG. 2(b) shows only one particular example of how the detection signal may be output, but the present invention is of course not limited to this particular example, and other ways are also envisioned, for example using a two wire interface in which power is provided from the outside, and the sensor device requires only two pins, and data is communicated back by means of a small or a large current consumption, in this case the GPIO pin can be omitted; or for example via a serial interface (e.g. an I²C interface or a Two-Wire LIN interface or TWI-interface), or via a parallel interface, or via any other suitable interface, for example by outputting an analog voltage signal having for example three possible levels, which makes it capable of not only outputting the detected target position, but to also output an error condition, e.g. as may be used in FIG. 10(c).

FIG. 3(a) to FIG. 7(b) shows several examples of proximity sensor systems, comprising a proximity sensor device and a target. The proximity sensor devices comprise one or more transmitter coils Tx1, Tx2 and one or more receiver coils Rx1, Rx2 and corresponding electronics (not shown) fully integrated in a monolithic device. The target (e.g. a metal target or a magnetic target) is movable between a first predefined position and a second predefined position relative to the proximity sensor device, and more specifically, relative to said coils.

As will be explained in FIG. 8(b), the transmitter coil Tx1 has a spiral course implemented in at least one, or at least two "metal layers" of the "interconnection stack" located on top of the so called "active surface" of the semiconductor substrate. An orthogonal projection of this spiral course on the active substrate of the semiconductor substrate defines a first (e.g. ribbon-shaped) region ZTx1 having a first inner periphery Pi1 and a first outer periphery Po1. These can also be considered as the inner and outer periphery of the spiral course itself.

Likewise, as will be explained in FIG. 9(b), the receiver coil Rx1 also has a spiral course implemented in at least one, or at least two "metal layers" of the "interconnection stack" located on top of the "active surface" of the semiconductor substrate. An orthogonal projection of this spiral course on the active substrate of the semiconductor substrate defines a second (e.g. ribbon-shaped) region ZRx1 having a second inner periphery Pi2 and a second outer periphery Po2.

Referring back to FIG. 3(a), it can be seen that the outer periphery Po2 of the second (ribbon-shaped) region ZRx1 corresponding to a projection of the receiver windings on the active surface, is located completely inside the inner periphery Pit of the first (ribbon-shaped) region ZTx1 corresponding to a projection of the transmitter windings on the active surface. For ease of the description, abstraction can be made of the implementation in the height direction of the semiconductor device, and the relative position of the coils and the metal plate 302 in FIG. 3(a) can be formulated as: the receiver coil Rx1 is "located inside" the transmitter coil Tx1, and the target 302 is not "overlapping" any of these coils, meaning in fact that an orthogonal projection of the metal plate 302 on the active surface of the semiconductor substrate of the sensor device 301, does not overlap with any of the (e.g. ribbon-shaped) region ZTx1 corresponding to the windings of the transmitter coil Tx1 or the (ribbon-shaped) region ZRx1 corresponding to the windings of the receiver coil Rx1. This is a first position of the target 302.

In FIG. 3(b) the target is in its second position, and as can be seen, a projection of the target completely overlaps a projection of the Tx1 coil as well as a projection of the Rx1 coil.

A simple detection mechanism may work as follows:

Assuming that the target 302 is not in the vicinity of the coils as shown in FIG. 3(a), when an alternating current is applied to the transmitter coil Tx1, an alternating magnetic field is created by the alternating current flowing through the windings of the transmitter coil Tx1. Due to inductive coupling, the receiver coil Rx1 will experience an alternating flux, which will generate an alternating voltage between the start and end node of the receiver coil.

When the target 302 is brought in the vicinity of the coils as shown in FIG. 3(b), when the same alternating current is applied to the transmitter coil Tx1, the same alternating magnetic field will be created by the transmitter coil Tx1, but now eddy currents will flow in the target 302, which will reduce the alternating magnetic flux received by the receiver coil Rx 1, thus causing the voltage between the start and end node of the receiver coil Rx1 to be reduced.

Thus, by measuring the voltage between the start and end node of the receiver coil Rx1, and by comparing this value with a predefined threshold voltage, the proximity sensor device is capable of determining whether the target is in the vicinity of the coils, or not.

Of course, more complex detection schemes can be used, a few of which will be described in more detail in FIG. 11(a) to FIG. 12(b).

Figure 4A:
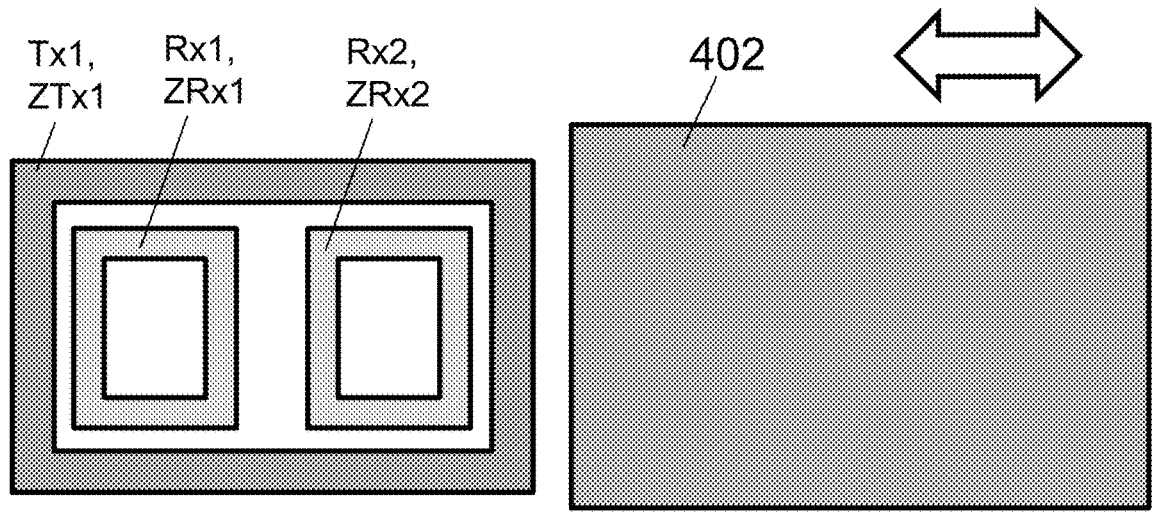

FIG. 4(a) shows a proximity sensor system 400 comprising a target 402 movably arranged with respect to a proximity sensor device 401 having a single transmitter coil Tx1 and two reception coils Rx1, Rx2. The proximity sensor system 400 of FIGS. 4(a) to 4(c) can be regarded as a variant of the proximity sensor system 300 of FIGS. 3(a) and 3(b), with the main difference that the sensor device 401 has two receiver coils instead of only one. Again, only the ribbon-shaped regions are shown, and abstraction is made of the height dimension, for ease of the description. As can be seen, the two reception coils Rx1, Rx2 are located next to each other, and both are located inside the transmitter coil Tx1.

Figure 4B:
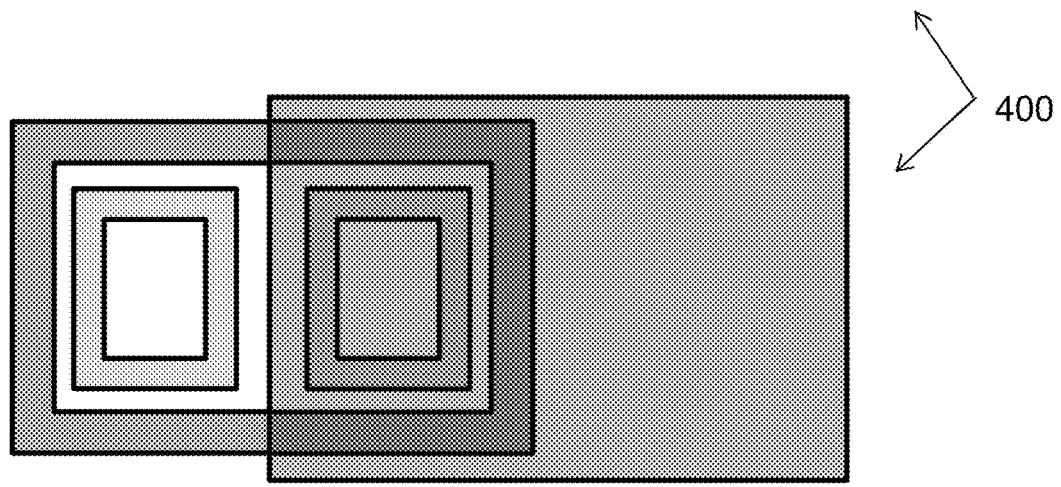
Figure 4C:
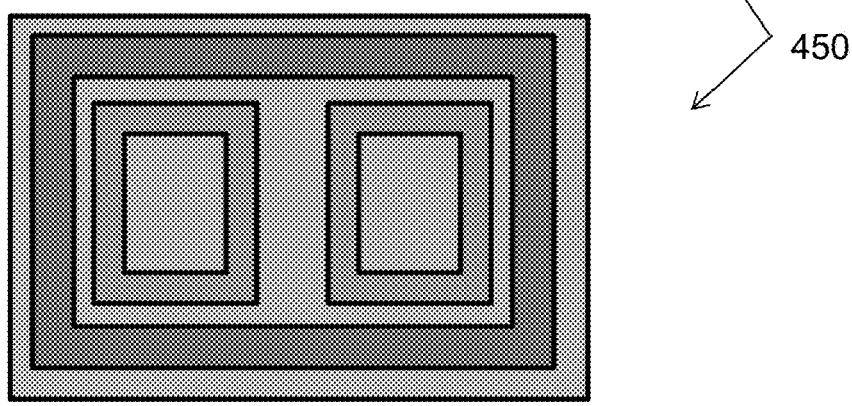

In fact, FIG. 4(a) to FIG. 4(c) illustrate two different embodiments of a proximity sensor system:
 i) a proximity sensor system 400, wherein the target 402 is movable between a first position in which the target "overlaps" none of the receiver coils as shown in FIG. 4(a), and a second position in which the target "overlaps" only one of the receiver coils as shown in FIG. 4(b);
 ii) a proximity sensor system 450, wherein the target 402 is movable between a first position in which the target "overlaps" only one of the receiver coils as shown in FIG. 4(b), and a second position in which the target overlaps both of the receiver coils.

In an embodiment the proximity sensor devices 401, 451 of FIG. 4(a) to FIG. 4(c) may comprise a single transmitter circuit, and a single receiver circuit, and the two receiver coils Rx1, Rx2 may be connected in series or in parallel, and the evaluation circuit may be configured for testing whether the combined received signal is higher or lower than a predefined threshold.

In another embodiment, the proximity sensor devices 401, 451 of FIG. 4(a) to FIG. 4(c) may comprise a single transmitter circuit for exciting the transmitter coil, and two receiver circuits, one for each receiver coil, and the evaluation circuit may be configured for comparing the signals obtained from both receiver circuits, or for subtracting the signals obtained from both receiver circuits and for comparing said difference with a predefined threshold.

Figure 5A:
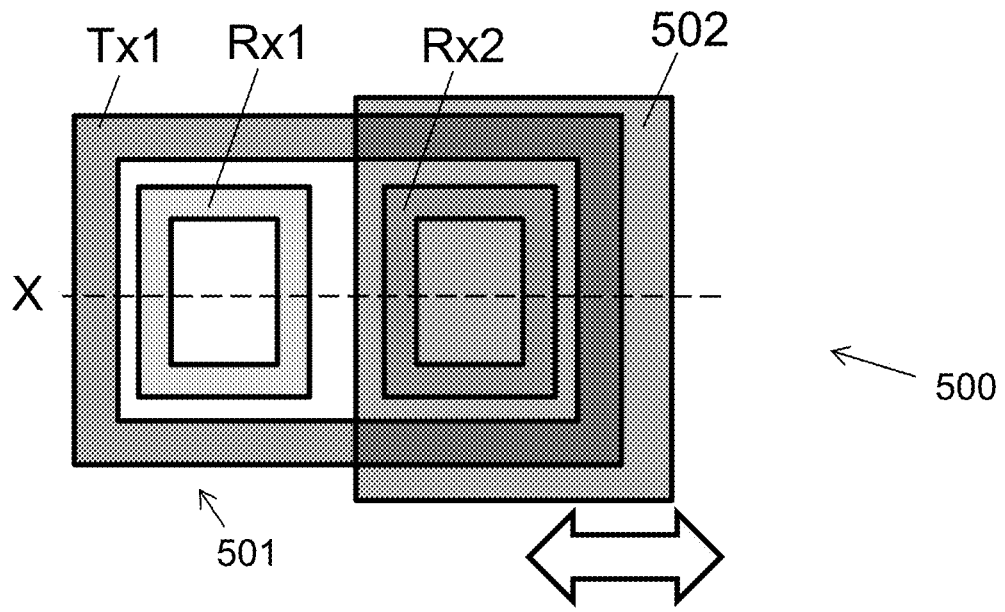
Figure 5B:
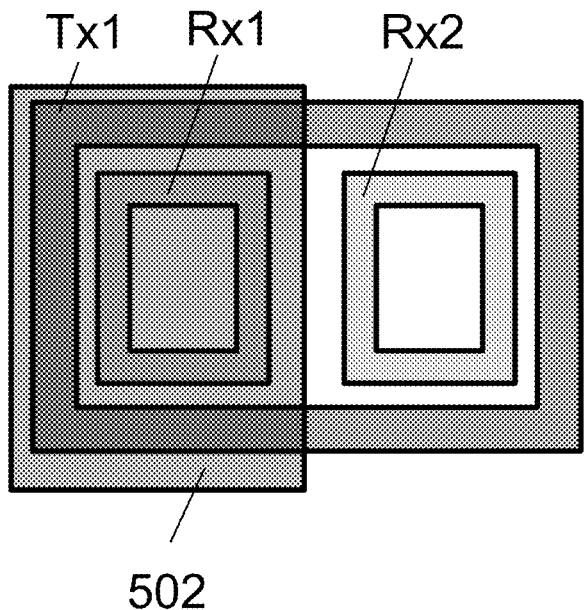

FIG. 5(a) and FIG. 5(b) show a proximity sensor system 500 comprising a target 502 (e.g. a metal target or a magnetic target) movably arranged with respect to a proximity sensor device 501 having a single transmitter coil Tx1 and two reception coils Rx1, Rx2. The proximity sensor system of FIGS. 5(a) and 5(b) can be regarded as a variant of the proximity sensor system 300 of FIG. 3(b) having two receiver coils instead of only one or can be seen as a variant of the proximity sensor system 400 of FIGS. 4(a) to 4(c) with a different target. More specifically, the target 502 of FIGS. 5(a) and 5(b) is configured for moving between a first position in which only one of the receiver coils is overlapped (e.g. only Rx2 in FIG. 5(a)), and a second position in which only the other of the receiver coils is overlapped (e.g. only Rx1 in FIG. 5(b)).

In the example shown in FIG. 5(a) and FIG. 5(b) the target 502 is relatively small and is movable in a direction X parallel to a virtual line passing through the centres of the first and second receiver coil, but other arrangements are possible, for example a target having two through-holes, an example of which will be described in FIG. 10(a).

Figure 6A:
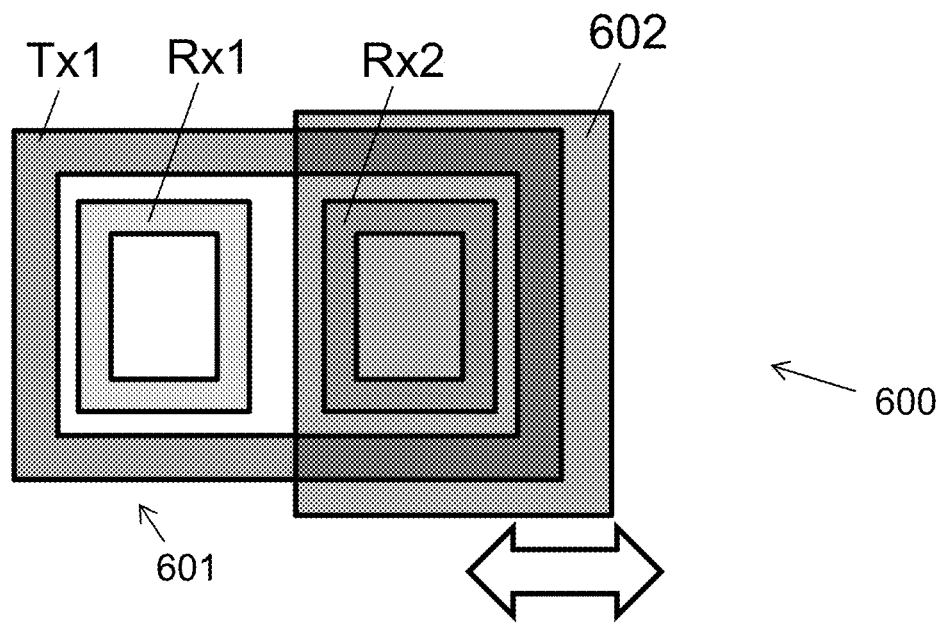
Figure 6B:
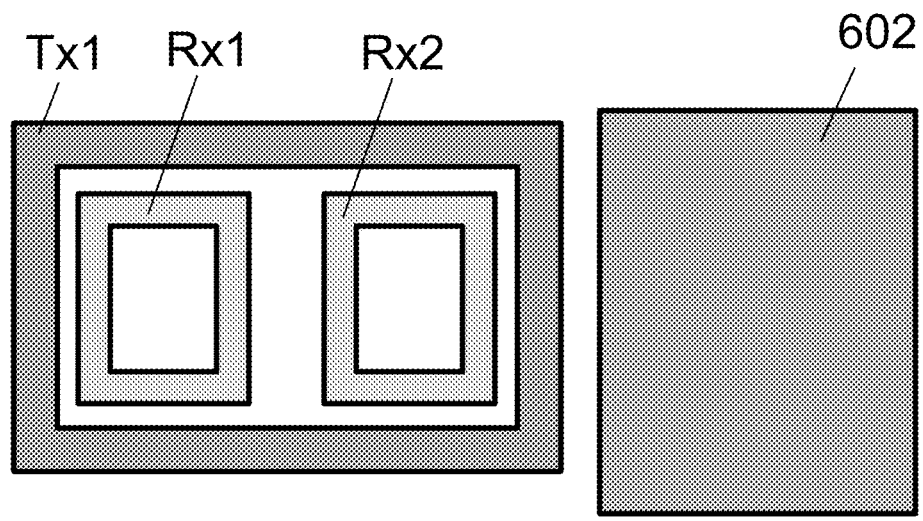

FIG. 6(a) and FIG. 6(b) show a proximity sensor system 600 similar to that of FIG. 5(a) and FIG. 5(b), but wherein the target 602 is configured for overlapping only one of the receiver coils Rx2 when in its first position, shown in FIG. 6(a), or for overlapping none of the receiver coils when in its second position, shown in FIG. 6(b). This arrangement is comparable to the system 400 of FIG. 4(a) and FIG. 4(b) but uses a smaller target 602.

FIG. 7(a) and FIG. 7(b) show a proximity sensor system 700 similar to that of FIG. 4(a) and FIG. 4(b), but wherein the proximity sensor device 701 comprises two transmitter coils Tx1, Tx2 instead of only one. As can be seen, the first and second transmitter coil Tx1, Tx2 are located next to each other, the first receiver coil Rx1 is located inside the first transmitter coil Tx1, and the second receiver coil Rx2 is located inside the second transmitter coil Tx2. The sensor device 701 may have a single transmitter circuit configured for simultaneously exciting both transmitter coils Tx1, Tx2 with the same polarity (e.g. when the current in Tx1 flows in clockwise direction, the current in Tx2 also flows in clockwise direction, so that the magnetic field created by Tx1 in the center of Rx1 is pointed in the same direction as the magnetic field created by Tx2 in the center of Rx2); or with opposite polarity (e.g. when the current in Tx1 flows in clockwise direction, the current in Tx2 flows in counter-clockwise direction, so that the magnetic field created by Tx1 in the center of Rx1 is pointed in the opposite direction as the magnetic field created by Tx2 in the center of Rx2). The latter may consume less power. The evaluation circuit is configured for determining whether the target is in the position shown in FIG. 7(a) wherein none of the receiver coils is overlapped by the target, or in the position shown in FIG. 7(b) wherein only one receiver coil is overlapped by the target. The sensor device 700 may have a single receiver circuit, and the two receiver coils may be connected in series, or the single receiver circuit may be selectively coupled to one of the receiver coils, e.g. depending on which transmitter coil is being activated, or the sensor device may have two individual receiver circuits, each connected to one of the receiver coils.

FIG. 7(b) is used in two different embodiments, but only one picture is shown.

FIG. 7(b) and FIG. 7(c) show a proximity sensor system 750 similar to that of FIG. 4(b) and FIG. 4(c), which is a variant of the proximity sensor system 700 described above, wherein the evaluation circuit is configured for determining whether the target 702 is in the position shown in FIG. 7(b) wherein only one receiver coil Rx2 is overlapped by the target, or whether the target is in the position shown in FIG. 7(c) wherein both receiver coils Rx1, Rx2 are overlapped by the target 702.

The proximity sensor systems of FIG. 3(a) to FIG. 7(c) only show exemplary arrangements of proximity sensor devices and a target, but the present invention is not limited to these specific examples, and other arrangements can also be used, for example the arrangement of FIG. 10(a).

FIG. 8(a) to FIG. 8(d) illustrate how the first transmitter coil Tx1, and if present also the second transmitter coil Tx2, may be implemented in certain embodiments of the present invention. In the example shown in FIG. 8(a) to FIG. 8(d), the transmitter coil contains three spirals implemented in the metal layers M2, M3, M4, but the present invention is not limited thereto, and it is for example also possible to implement the transmitter coil in only one metal layer, e.g. as illustrated in FIG. 17(a) to FIG. 17(d).

Figure 8A:
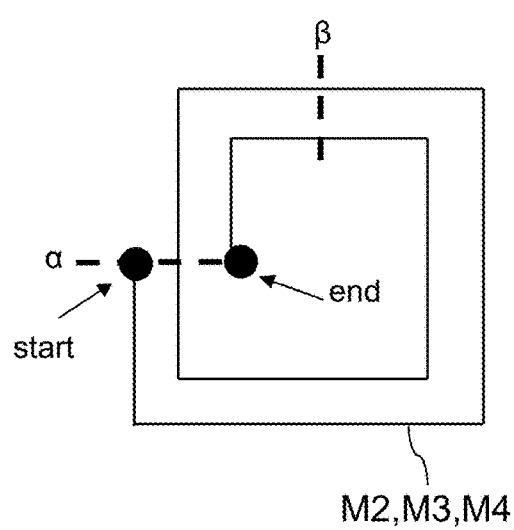
Figure 8B:
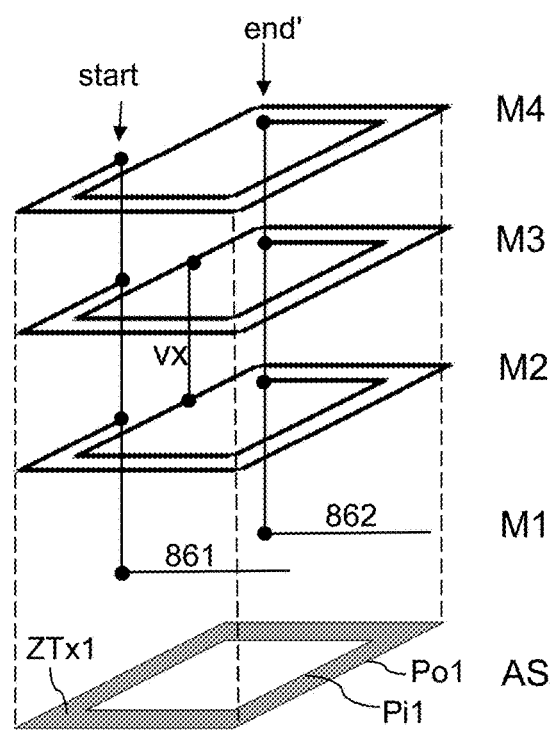
Figure 8C:
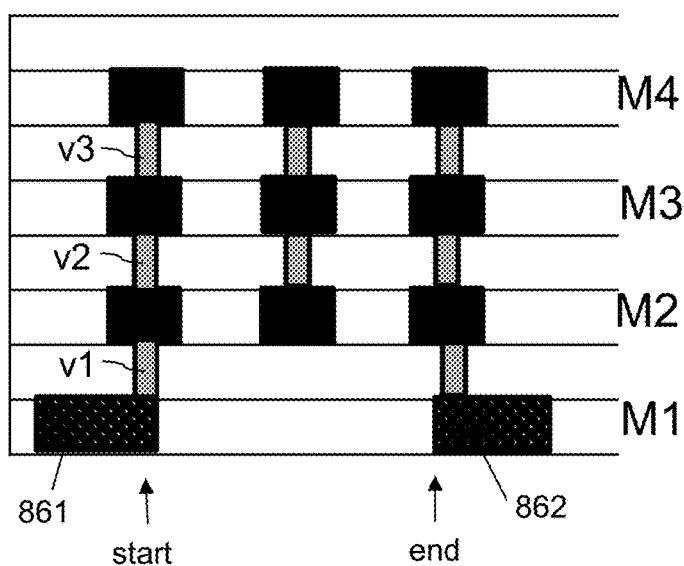
Figure 8D:
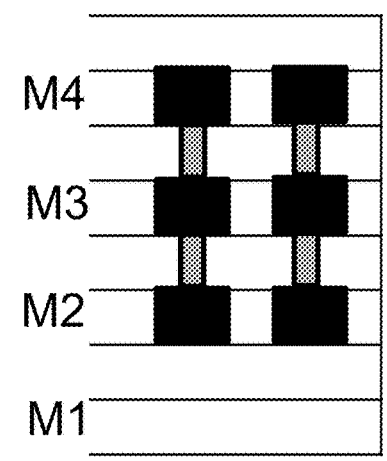

FIG. 8(a) shows a top view of an over-simplified Tx1 coil, having only two windings to keep the drawings simple. FIG. 8(b) shows a simplified perspective view, where the end is slightly shifted with respect to FIG. 8(a) for illustrative purposes. FIG. 8(c) shows a cross-sectional view in a plane a perpendicular to the semiconductor surface, passing through the start and end of FIG. 8(a). FIG. 8(d) shows a cross-section in plane (3, not containing the start or end. These drawings are not drawn to scale, but merely intended to illustrate the principles used.

According to principles of the present invention, the proximity sensor device is implemented as a monolithic integrated circuit, having a single semiconductor substrate (or a "single die"), preferably implemented in the CMOS process. The semiconductor substrate may be a silicon substrate.

The semiconductor substrate may have an active surface AS, which may also comprise at least the transmit circuit 210, the reception circuit 220 and the evaluation circuit 230, and at least one bond pad. The semiconductor substrate comprises at least one component selected from the group consisting of: an active component (e.g. a transistor), a passive component (e.g. a resistor or a capacitor), and a bond pad.

The semiconductor substrate may further comprise an interconnection stack above or on top of the active surface. The interconnection stack comprises a plurality of at least two metal layers, for example four metal layers M1, M2, M3, M4 separated by isolation layers (e.g. silicon dioxide).

According to principles of the present invention, the first transmitter coil Tx1 has a first spiral course with at least three turns (or windings) formed in a first subset S1 of at least one or at least two metal layers (e.g. M2 and M3, or M2 and M4, or M3 and M4 or M2 and M3 and M4) selected from said plurality of metal layers.

In certain embodiments of the present invention, the transmitter coil Tx1 is formed in three metal layers M2 to M4, and comprises about 25 to about 30 turns, e.g. 27 turns or 28 turns in each of these layers. In fact, the number of turns does not have to be an integer number, and for example, the transmitter coil Tx1 may also contain 27.2 or 27.5 turns, as an example.

The spiral tracks may have a rectangular cross section having a width of about 6 to about 8.5 µm, and a height of about 3 to about 5 µm. The spacing between adjacent track portions may be in the range from about 1 µm to about 5 µm.

The first metal layer M1 may be used to connect the start and the end of the spiral of metal layer M2 with the transmitter circuit, e.g. via connection 861 and 862 implemented in metal layer M1.

An orthogonal projection of the spiral course of the first transmitter coil Tx1 on the active surface of the substrate defines a first region (e.g. ribbon-shaped region) ZTx1 having a first inner periphery Pi1 and a first outer periphery Po1. Preferably no active or passive components or bond pads are implemented in the active surface "AS" between the first inner periphery Pi1 and the first outer periphery Po1, in order to reduce or minimise capacitive coupling of the Tx1 coil, although it may.

In preferred embodiments of the present invention, the spirals of the transmitter coil Tx1 are connected in parallel, at their start and end position. Preferably, the spirals of the transmitter coil Tx1 are not only interconnected at their very start and very end, but also via "additional interconnections" at multiple locations in between the start and end position, for example at least once every turn, or at least four times every turn, or at least every 50 µm along the spiral track, or at least every 5 µm along the spiral track, by means of vias. One such "additional via vx" is shown in FIG. 8(b), by way of example.

Alternatively, the spirals of the transmitter coil Tx1 may be connected in series.

FIG. 9(a) to FIG. 9(d) illustrate how the at least one receiver coil Rx1 may be implemented in certain embodiments of the present invention. In the example shown in FIG. 9(a) to FIG. 9(d), the receiver coil contains two spirals implemented in the metal layers M2, M3, but the present invention is not limited thereto, and it is for example also possible to implement the receiver coil in only one metal layer, e.g. as illustrated in FIG. 18(a) to FIG. 18(d).

FIG. 9(a) shows a kind of top view of an over-simplified Rx1 coil, having only two windings (or "turns") to keep the drawings simple. FIG. 9(b) shows a simplified perspective view, where the end is slightly shifted with respect to FIG. 9(a) for illustrative purposes. FIG. 9(c) shows a combined picture of three cross-sectional views in three planes perpendicular to the semiconductor surface, one passing through the start (containing track 871), one passing through the interconnection (containing track 873), and one passing through the end (containing track 872). FIG. 8(d) shows a cross-section in plane (3, not containing the start or end or intermediate interconnection. These drawings are not drawn to scale, but merely intended to illustrate the principles used.

According to principles of the present invention, the first receiver coil Rx1 has a second spiral course with at least three turns (or windings) formed in a second subset S2 of at least one or at least two metal layers (e.g. M2 and M3, or M2 and M4, or M3 and M4, or M2 and M3 and M4) selected from said plurality of metal layers. The spirals of the Rx1 coil of the different layers may be connected in series, in order to obtain a large inductance.

The first subset S1 and the second subset S2 both use at least one same metal layer. In the example of FIG. 8(a)-(d) and FIG. 9(a)-(d), both the Tx1 coil and the Rx1 coil use metal layers M2 and M3.

In embodiments of the present invention, the receiver coil Rx1 may be formed in only two metal layers (e.g. M2 and M3, or M2 and M4, or M3 and M4), and may comprise about 30 to 40 windings in each layer, for example 35×2=70 windings in total. In other embodiments of the present invention, the receiver coil Rx1 may be formed in three metal layers (e.g. M2 and M3 and M4), and may comprise about 30 to 40 turns in each layer, e.g. 34×3=102 windings in total. The spiral tracks may have a rectangular cross section having a width of about 5 µm, and a height of about 3 µm, and a spacing of about 0.5 or 0.6 µm.

The first metal layer M1 may be used to connect the start of the first spiral, and the end of the last spiral, but also to interconnect the spirals, (see for example interconnection 873 of FIG. 9(b)).

An orthogonal projection of the spiral course of the first receiver coil Rx1 on the active surface of the substrate AS defines a second region (e.g. ribbon-shaped region) ZRx1 having a second inner periphery Pi2 and a second outer periphery Po2. Preferably no active or passive components or bond pads are implemented in the active surface AS between the second inner periphery Pi2 and the second outer periphery Po2, in order to reduce or minimise capacitive coupling of the Rx1 coil.

FIG. 10(a) shows another proximity sensor system 1000, which can be considered a variant of the proximity sensor system 500 of FIG. 5(a)-(b). As can be seen, the proximity sensor device of FIG. 10(a) also comprises one transmitter coil Tx1 and two receiver coils Rx1, Rx2, but the target 1002 has a first and a second rectangular opening 1091, 1092 which are offset in the X-direction and in the Y-direction. The target 1002 is movable parallel to the sensor device in a direction perpendicular to a virtual line X passing through the centres of the receiver coils Rx1, Rx2.

When the target 1002 is in its second position, shown in FIG. 10(a), a metallic or conductive portion of the target overlaps the first receiver coil Rx1 while the second opening 1092 overlaps the second receiver coil Rx2. When the target 1002 is in its first position (not shown), a metallic portion of the target overlaps the second receiver coil Rx2 while the first opening 1091 overlaps the first receiver coil Rx1, or vice versa.

FIG. 10(b) shows an example of a measurement by the proximity sensor system 1000 of FIG. 10(a), showing a difference (in arbitrary units) between the signal strength received by the first receiver coil Rx1 and the second receiver coil Rx2, as a function of the position Y of the target 1002 along the Y axis. The receiver coils Rx1 and Rx2 may be connected in series, and the combined, differential signal may be evaluated, e.g. by active subtraction through an amplifier; or the receiver coils Rx1 and Rx2 may be connected in parallel, and the signals received by Rx1 and Rx2 may be subtracted passively, and the result may be applied as a single-ended input signal to an amplifier, and may be referred to a reference voltage.

In applications wherein the proximity sensor system is used to detect whether the target 1002 is either in its first position or in its second position, it suffices to compare the measured difference signal with a single threshold voltage Vth. In particular, if the difference signal is larger than the threshold voltage Vth the target is in its first position, and if the difference signal is smaller than the threshold voltage the target is in its second position. In these applications, the transition zone between the first and second position is not taken into account.

In a practical implementation, a Schmitt trigger may be used instead of a simple comparator, because a Schmitt trigger has a certain hysteresis, to avoid unwanted toggling during the transition from the first position to the second position.

It is noted that the two openings 1091 and 1092 of the particular target shown in FIG. 10(a) both have a rectangular shape, but that is not absolutely required for the invention to work, and other shapes may also be used, e.g. a triangular shape or a trapezoidal shape or even a circular shape or an elliptical shape. Also, in a practical implementation, the mutual position of the two openings 1091, 1092 may be different from that shown in FIG. 10(a). For example, the two openings may be spaced from each other in the X-direction by distance 1093 which may be larger than zero or equal to zero, and/or the two openings may be spaced from each other in the Y-direction by distance 1094, which may be larger than zero or equal to zero. These distances 1093 and 1094 may be equal, or they can be different. The size of the openings, and the shape of the openings, and the offset between the openings may be optimized to obtain maximum signal amplitude. They may also be optimized to obtain a desired signal shape as a function of mechanical movement. But these aspects fall out of the scope of the present invention.

FIG. 10(c) shows a variant of FIG. 10(b), where the measured signal is compared with two threshold levels. Such a system also allows to detect that the target 1002 is in its first position when the difference signal is larger than the first threshold Vth1, and to detect that the target 1002 is in its second position when the difference signal is smaller than the second threshold Vth2, but additionally allows to detect a problem, e.g. a mechanical defect, if the difference signal is between the first and the second threshold longer than a predefined period. This offers additional functionality, which may be used e.g. for functional safety purposes.

FIG. 10(d) show measurement results for another proximity sensor system, when the target is moved parallel to the semiconductor device. In fact three curves are shown, a first curve (indicated with black square) for an arrangement where the target moves parallel to the sensor device at a distance g equal to 1.0 mm, a second curve (indicated with a black circle) for an arrangement where the target moves parallel to the sensor device at a distance g equal to 1.5 mm, and a third curve (indicated with a black triangle) for an arrangement where the target moves parallel to the sensor device at a distance g equal to 2.0 mm. As can be seen, the smaller the value of the air gap "g", the larger the signal. More specifically, the signal strength at a distance of 1.5 mm and at 2.0 mm was about 40% and 15% respectively, of the signal strength at 1.0 mm.

FIG. 10(e) is a plot derived from the measurements of FIG. 10(d) as may be used by another proximity sensor system where the target moves in a direction perpendicular to the sensor device. By comparing the measured signal with the threshold level Vth3 the sensor device can determine whether the target is closer or further than 1.0 mm from the sensor device. Likewise, by comparing the measured signal with the threshold level Vth4, the sensor device can determine whether the target is closer/further than 1.5 mm. By comparing the measured signal with the threshold level Vth5, the sensor device can determine whether the target is closer/further than 2.0 mm, etc. As can be appreciated from the measurement results in FIG. 10(d), if the signal-to-noise ratio is sufficiently large, a detection of the target up to about 2.5 mm or up to about 3.0 mm is also feasible.

FIG. 11(a) shows a schematic block diagram of an exemplary transmitter circuit 1110, and FIG. 11(b) shows a schematic block diagram of an exemplary receiver circuit 1120, followed by an exemplary evaluation circuit 1130, as may be used in embodiments of the present invention.

Transmitter circuits, receiver circuits, and evaluation circuits are known in the art, and are not the main focus of the present invention. The following explanation is provided only for completeness of the description; hence a brief description will suffice. For the same reason, the present invention is not limited to the specific circuits disclosed in FIG. 11(a) to FIG. 12(b), and other circuits may also be used.

The transmit circuit 1110 of FIG. 11(a) comprises a bridge circuit having a first branch in which a first transistor T1 and a second transistor T2 are connected in series between the supply voltage Vdd and ground voltage Vss, and a second branch in which a third transistor T3 and a fourth transistor T4 are connected in series between Vdd and Vss. The gate-nodes of the transistors are driven by complementary signals RCO, RCO' obtained from an oscillating circuit (not shown), e.g. an RC oscillator configured for oscillating at a frequency in the range from about 20 MHz to about 30 MHz, for example at about 24 MHz. The source-nodes of the transistors are connected to the supply or ground voltage, and the drain-nodes of the transistors are connected to an LC resonator (or LC tank), formed by the transmitter coil Tx1 and a capacitor C1.

In preferred embodiments of the present invention, the inductance of the transmitter coil is preferably relatively high, and the series resistance of the transmitter coil is preferably relatively low. The capacitor C1 is deliberately added in order to avoid that the effective capacitance of the LC oscillator is mainly determined by parasitic capacitances, which are moreover temperature dependent.

In preferred embodiments of the present invention, the LC circuit formed by the transmitter coil Tx1 and the capacitor C1 is not excited at its resonance frequency but is preferably driven at a frequency which is deliberately chosen slightly lower than the resonance frequency of the LC oscillator. This frequency may be generated by an RC oscillator circuit, optionally followed by a PSK (phase shift keying) modulator. In an embodiment the R and C of the RC oscillator are embedded in the semiconductor substrate and may even be situated inside the transmitter coil Tx1 and/or inside the receiver coil(s).

As described above, the main purpose of the transmit circuit 1110 is to cause an alternating current to flow through the transmitter coil Tx1, in order to create an alternating magnetic field, which can be sensed by the receiver coil(s).

FIG. 11(b) shows a circuit in which the two receiver coils Rx1, Rx2 are connected in series to create a differential voltage signal induced by an alternating flux received by the receiver coils, due to their inductive coupling with the transmitter coil Tx1. The difference signal is amplified by a differential amplifier, and then mixed or demodulated or down-converted using a reference signal "Ref" (e.g. a sinusoidal signal having a predefined frequency, e.g. obtained from the RCO oscillator, optionally followed by a PSK modulator). The demodulated signal may then be rectified (not shown) and/or low-pass filtered (LPF), to yield a signal indicative of the amount of flux received by the receiver coils, an example of which is shown in FIG. 10(b) to FIG. 10(d).

An advantage of using two receiver coils (as opposed to only one) is that they allow to more easily unbalance the differential amplifier, hence, improve the contrast. Another advantage is that the combined signal obtained from the two receiver coils may be insensitive to an external disturbance field, e.g. if they have opposite polarity.

This signal may then be further processed, such as for example compared to at least one threshold voltage Vth in the evaluation circuit 1130. The output of the comparator may be used to operate a switch as shown in FIG. 2(a), or may be output as an analogue signal, or may be digitised and output as a digital signal indicative for the position of the target, e.g. via a general input-output pin (GPIO) or via a serial communication bus (not shown), via a two-wire interface, etc.

FIG. 12(a) shows a schematic block diagram of another exemplary transmit circuit 1210, and FIG. 12(b) shows a schematic block diagram of another exemplary receiver circuit 1220, which can be used in embodiments of the present invention, and which can be seen as variants of the circuits of FIG. 11(a) and FIG. 11(b).

The main difference between the transmitter circuit 1210 of FIG. 12(a) and that of FIG. 11(a) is that the gates are not driven by the complementary signals of the RC oscillator itself, but are driven by signals fmod, fmod' derived therefrom, by modulation, for example by phase shift keying (PSK), more in particular, by BPSK modulation (binary phase shift keying) at a frequency of about 500 kHz to about 2 MHz, for example about 1 MHz.

The main difference between the receiver circuits 1220 of FIG. 12(b) and that of FIG. 11(b) is that the mixer or modulator or demodulator is not driven by the oscillator signal itself, but by a modulated, e.g. BPSK modulated version thereof.

The main advantage of using a modulator in the transmitter circuit and a corresponding demodulator in the receiver circuit is that the resulting signal "out" has a reduced influence from amplifier offset, thus allowing a more accuracy comparison with the threshold voltage.

Preferably a synchronous demodulator is used, although that is not absolutely required.

FIGS. 11(a) and 11(b) and FIGS. 12(a) and 12(b) show two single-stage transmitter and receiver circuits that may be used in the proximity sensor device, but of course the present invention is not limited to these specific circuits, and other transmitter and receiver circuits can also be used. In preferred embodiments, the receiver circuit has a least two, or at least three down-conversion stages, each with an amplifier and a demodulator. In this way the received signal can be amplified, and amplifier offset can be reduced. Such circuits are well known in the art, and hence need not be described in detail here.

FIG. 13(a) to FIG. 13(c) show examples of possible layouts, as may be used in embodiments of the present invention, in which the proximity sensor device comprises a single transmitter coil Tx1 and two receiver coils Rx1, Rx2. As mentioned above, the inventors have designed, implemented, and evaluated several test chips, in order to verify (i) whether it was possible at all to implement the transmitter coil(s) and the receiver coil(s) and the electronics (including inter alia the transmit circuit, the receiver circuit, and the evaluation circuit) on a single die, i.e. as a monolithic integrated semiconductor substrate; and (ii) whether the received signal(s) would be sufficiently large to be distinguishable from noise (or in other words, would have a sufficiently large signal-to-noise ratio, SNR); and (iii) whether the received signal(s) would be sufficiently different for the target in its first position versus its second position, especially taking into account a distance (air gap) of up to 2.0 mm, or even up to 2.5 mm, or even up to 3.0 mm;

(iv) last but not least, if the circuits would work, whether the circuits would still reliably work if one or more active components (e.g. transistors, amplifiers, etc.), and/or passive components (e.g. resistors, capacitors, etc.), and/or bond pads would be implemented on the area inside the inner periphery of any of the coils.

The inventors were confronted with many prejudices, challenges, and uncertainties, for example, how to make a coil with a relatively high inductance and a relatively low series resistance on a relatively small chip (e.g. of about 1.0 mm×2.0 mm), allowing only a very limited number of windings, taking into account that the tracks need to be very small, there needs to sufficient distance between the tracks, etc., which means that the "quality factor" of the transmitter would be rather poor (e.g. in the range from about 1.3 to about 3.5), hence, the received signals would be very weak. It was not sure whether the receiver signals would be sufficiently large with respect to noise. And it was impossible to predict the impact of placing active or passive components, in particular components with metal parts (e.g. capacitors, bond pads) inside the receiver coils, in particular how the weak receiver signals would influence the circuitry and vice versa.

For completeness it is noted that the test-chips may not be fully space-optimized, in order to reduce the amount of design and layout work, but also to keep the layout of various modules as similar as possible. Hence, the indications of chip area presented further are not to be considered as absolute values, or as the most optimal values, but they are good indicators of what may be achievable.

FIG. 13(a) gives a rough impression of how much area would be required if all active and passive components and bond pads 1350 are located outside the area defined by the transmit and receive coils, or more specifically, outside the outer periphery Po1 of the transmit coil. Again, while it may be possible to further reduce the size of this layout by moving the receiver coils closer together, and decreasing the size of the transmitter coil, that was not done, because the inventors wanted to compare the performance of the various test-chips in which the coils remained the same, but certain elements were moved inside the ribbon-shaped regions.

FIG. 13(b) shows one of the layouts of the test-chips, showing how much area would be required if all active and passive components and bond pads 1350 are located inside the inner periphery Pit of the transmit coil Tx1, but outside of the outer peripheries Po2a, Po2b of the receiver coils Rx1, Rx2.

FIG. 13(c) shows another layout of one of the test-chips, in which a first portion 1350a of the active and/or passive components and/or bond pads (in the specific example: two bond pads) are located inside the inner periphery of the first receiver coil Rx1, a second portion 1350b of the active and/or passive components and/or bond pads (in the specific example: two bond pads) are located inside the inner periphery of the second receiver coil Rx2, and the remaining active and passive components and bond pads 1350c are located inside the inner periphery of the transmit coil Tx1, but outside of the outer peripheries of the receiver coils Rx1, Rx2. Preferably the layout of the two receiver coils and the components therein are symmetrical (e.g. mirrored). For completeness, it is noted that all the test chips are coreless, i.e. they do not have an integrated magnetic concentrator, or flux guide.

The test-chips were evaluated and the outcome of the experiments can be summarized as follows: the chip-size is about 3 to 4 mm² (e.g. 2.0 mm×2.0 mm, or 1.4 mm×2.15 mm), typical distance to target: 0.2 mm to 1 mm, or 0.2 mm to 2 mm, or 0.2 to 3 mm, the supply voltage used was about 3V dc, the power consumption of the entire chip was about 15 to 20 mW, the power consumed by the transmit circuit and the transmitter coil was about 6 to 10 mW. The frequency of the RC oscillator was about 24 MHz. This frequency was divided by a factor ten (10), to generate a digital clock of 2.4 MHz, which was further divided by a factor two to obtain a BPSK frequency of 1.2 MHz. The current flowing in the transmitter coil Tx1 has an amplitude in the order of about 0.5 to 10 mA, and the differential signal detected by the receiver coils had an amplitude in the order of about 10 µV to 10 mV (depending on the air gap and temperature), and it was found that the resulting signal (after amplification and demodulation) had a sufficiently high signal-to-noise ratio (higher than than 20 dB, as can be appreciated from FIG. 10(b) to FIG. 10(d)), to allow reliable detection of whether the target is in its first or second position. This paragraph is provided for illustration purposes only, but of course, the present invention is not limited to these specific numbers, and other numbers can also be used, for example a supply voltage of 5V or 12V may also be used.

It was quite surprising that substantially no interference between the RF signal and the digital circuitry was found. One would expect that unrelated clocks would have to be used in order to avoid or reduce interference, but that turned out not to be the case. While in the test chips the digital clock frequency was generated by dividing the RF frequency by a factor 10, other division factors in the range from 2 to 20 can also be used, for example 4 or 5 or 6 or 8 or 12 or 16.

The inventors were very surprised to discover that the detection of the test chips worked reliably for an air gap of up to 2.0 mm, and the signal-to-noise ratio (SNR) indicated that the detection may even work for an air gap of up to 2.5 mm, or even up to 3.0 mm, optionally by using a higher supply voltage and/or a higher transmit power. This is much better than known prior art systems, in which the coil diameters need to be at least six times the maximum air gap, i.e. have a diameter of at least 18 mm.

In some test-chips, bond pads were located inside the inner periphery of the ribbon-shaped region of the receiver coils, and it also works.

In some test-chips, a capacitor array was located inside the inner periphery of the ribbon-shaped region of the receiver coils, and it also works, which was quite surprising, because capacitors contain a lot of metal.

In some test-chips, both analog circuitry and digital circuitry was located inside the inner periphery of the ribbon-shaped region of the receiver coils, and it also works, which was also very surprising, especially in view of the extremely small signal(s) received by the receiver coils. One would expect that the analog and digital circuitry would disturb the receiver signals, or vice versa.

The skilled person having the benefit of the present disclosure—once it is published—will of course be able to put more electronics and/or all bond pads inside the inner periphery of the receiver coils and further optimize the design, by applying the teachings of the present invention.

FIG. 14(a) to FIG. 14(c) are an abstract representation of FIG. 13(a) to FIG. 13(c), originally made in colour to calculate the area of the different zones, but rendered in shading in this patent application, because patent applications cannot be filed in colour at the time of filing this application.

A comparison of FIG. 14(a) and FIG. 14(b) shows that moving the circuitry 1450 inside the Tx1 coil resulted in a saving of about 15%.

A comparison of FIG. 14(b) and FIG. 14(c) shows that furthermore moving a portion of the circuitry inside the Rx1 and Rx2 coils, resulted in an additional saving of about 3.25%, but there is room for a further reduction. Indeed, the partial area occupied by the various zones of the layout of FIG. 14(b) is listed in the following table:

| | |
|---|---|
| (ribbon-shaped) region ZTx1 of the transmitter coil | about 40% |
| (ribbon-shaped) regions ZRx1 + ZRx2 of the receiver coils | about 29% |
| electronics + bondpads | about 13% |
| space available inside inner periphery of the receiver coils | about 11% |

From the table, it can be concluded that, if the space inside the inner periphery of the receiver coils would be completely filled with electronics, and the receiver coils would be moved closer together, and the size of the transmitter coil would be decreased, and assuming that the performance remains approximately the same, the chip area of FIG. 14(b) would be reduced by 11%, which is huge, but maybe somewhat over-optimistic.

As another example to estimate the amount of area that could be saved, which may be regarded as an underestimation of what is achievable, the electronics region 1450 of FIG. 14(b) was artificially divided in eight equal parts, and one 1450a of these eight parts was moved inside the inner periphery of the first receiver coil Rx1, and a second

1450*b* of these eight parts was moved inside the inner periphery of the second receiver coil, and the zone with the remaining six parts 1450*c* was made smaller, the distance between the receiver coils decreased, and the size of the transmit coil decreased. In this example ⅜=¼ of the area of 13% may be saved, which is about 3.25% of the chip area of FIG. 14(*b*). That is still a huge saving, made possible by the principles and discoveries of the present invention.

Overall, the area of the sensor device of FIG. 14(*a*) can thus be reduced by a value in the range from about 18.25% (i.e. 15%+3.25%) to about 26% (i.e. 15%+11%), which is huge.

FIG. 15(*a*) shows another example of a possible layout which can be used in embodiments of the present invention. In this example, the proximity sensor device has two transmitter coils Tx1, Tx2 and two receiver coils Rx1, RX2, and electronics 1550 in the region between the two transmitter coils, and two bond pads located inside the inner periphery of the ribbon-shaped region of the first receiver coil Rx1, and two bond pads located inside the inner periphery of the ribbon-shaped region of the second receiver coil Rx2. As mentioned above, this is not a fully optimized design.

Both transmitter coils may be driven by the same excitation signal or by excitation signals having opposite polarity, and the receiver coils may again be connected in series (such that the signals are subtracted), and the terminals may again be connected to a differential amplifier.

FIG. 15(*b*) gives a rough impression of how much area would be required if all active and passive components and bond pads would be located outside of the area defined by the transmit and receive coils. The partial area occupied by the various zones of the layout of FIG. 15(*b*) is listed in the following table:

| | |
|---|---|
| (ribbon-shaped) regions of Tx1 + Tx2 | about 39% |
| (ribbon-shaped) regions of Rx1 + Rx2 | about 23% |
| electronics + bond pads | about 21% |
| space available inside Rx1 + Rx2 (receiver coils) | about 15% |

Thus, in theory, if the space inside the receiver coils could be completely filled, the required chip area would be decreased by 15%. This can be regarded as an upper limit.

FIG. 15(*c*) gives an impression of how much area may be saved if a portion of the circuitry is "moved" into the inner periphery of the ribbon-shaped regions of the receiver coils. The area 1550 of FIG. 15(*b*) was divided in 16 equal portions, and two of these portions 1550*a* were moved into the coil Rx1, and two additional portions 1550*b* were moved into the coil Rx2, resulting in a reduction of the chip area by about 5%. That is a huge saving, made possible by the principles and discoveries of the present invention, demonstrating that a monolithic proximity sensor device can be built with electronics (e.g. active and/or passive components) and/or bond pads can be placed inside the inner periphery of the transmitter coil(s) and/or receiver coil(s).

FIG. 16 shows an example of a shielding 1600, e.g. a metal shielding as may be arranged for example between the windings of the transmitter coil and the one or more receiver coil(s). In this way, capacitive coupling between the transmitter coil and the receiver coil can be reduced. Such a shielding may also be arranged between the transmitter coil and electronic components, or bond pads situated inside the inner periphery of said transmitter coil to reduce capacitive coupling between the transmitter coil and said components or bond pads. Such a shielding may also be arranged between the receiver coil(s) and electronic components, or bond pads situated inside the inner periphery of said receiver coil(s) to reduce capacitive coupling between the receiver coil(s) and said components or bond pads.

In the specific example shown, the shielding comprises four substantially planar walls, but that is not absolute required. In the example of FIG. 16, these walls are not interconnected, but they may be interconnected for example at three of the four corners, provided that an orthogonal projection of the walls does not form a loop which would create eddy currents. The walls may be left floating or may be connected to ground or the supply voltage. In the example shown, a passage for two signals is provided in metal layer M1, but of course, more than two or less than two passages may be provided.

FIG. 17(*a*) to FIG. 17(*d*) is a variant of FIG. 8(*a*) to FIG. 8(*d*) and schematically illustrate how a transmitter coil having only one spiral with at least three turns, may be implemented in a single metal layer, as may be implemented in embodiments of the present invention. In the example shown, the spiral is implemented in metal layer M2, and metal layer M1 is used to connect the start and end point of the spiral to the transmitter circuit (not shown), but the present invention is not limited hereto, and other metal layers may also be used.

FIG. 18(*a*) to FIG. 18(*d*) is a variant of FIG. 9(*a*) to FIG. 9(*d*) and schematically illustrate how a receiver coil having only one spiral may be implemented in a single metal layer, as may be implemented in embodiments of the present invention. In the example shown, the spiral is implemented in metal layer M3, and metal layer M1 is used to connect the start and end point of the spiral to the transmitter circuit (not shown), but the present invention is not limited hereto, and other metal layers may also be used.

FIG. 19 shows another way to decrease capacitive coupling between a transmitter coil Tx and a receiver coil Rx. The spiral tracks of the transmitter coil and the receiver coil may be implemented mainly in a single metal layer of the interconnection stack (apart from the cross-over junctions 1997*a*, 1997*b*, 1998, which can be implemented by forming a U-shape or a bridge using two vias per cross-over), or may be implemented in multiple metal layers of the interconnection stack, in which case the "cross-overs" occur in different layers and hence do not require vias.

As can be seen, a projection of the transmitter coil of FIG. 19 is substantially symmetrical about the Y-axis, apart from the cross-over junctions 1997*a*, 1997*b*. This causes the voltage swing at each point of the transmitter coil to decrease from the outer periphery towards the inner periphery. This is true irrespective of the layout of the RX coil. In the example of FIG. 19, an orthogonal projection of the RX coil also has a symmetry axis, but that is not absolutely required.

In the example shown, each of the TX and RX coil has only three turns, in order not to overload the picture, but of course, the present invention is not limited thereto.

In the example of FIG. 19, both the TX coil and the RX coil have an orthogonal projection which is substantially symmetric about the Y-axis (apart from the cross over junctions). The start point c1 and the end point c2 of the transmitter coil Tx are located at the outer periphery of the transmitter coil Tx. The transmitter circuit (not shown in FIG. 19) is configured to apply an alternating voltage AV1 between these points. As a result, the voltage swing AV1 between the start c1 and the end c2 of the transmitter coil Tx is larger than the voltage swing AV2 more inwardly. In general, when using such a structure, the voltage swing decreases from the outer periphery of the TX coil towards the inner periphery.

In the example of FIG. 19, the start point c3 and the end point c4 of the receiver coil Rx are located at the inner periphery of the receiver coil Rx. Hence the voltage swing is relatively low at the outer periphery of the RX coil, and increases towards the inner periphery, and towards the start point and end point c3, c4.

It is noted that the voltage swing ΔV1 applied by the transmitter circuit is relatively large, while the voltage swing ΔU1 induced by the alternating magnetic field is relatively low. This is why a symmetrical layout of the TX coil results in a significant reduction of capacitive coupling between the TX coil and the RX coil. A symmetrical layout of the RX coil may provide a further reduction of this capacitive coupling, but as mentioned above, is not absolutely required for the invention to work.

As far as is known to the inventors, a coil arrangement as illustrated in FIG. 19, comprising a transmitter coil TX and a receiver coil RX, each implemented in one or more metal layers of the interconnection stack of a semiconductor device, where an orthogonal projection of the receiver coil RX is located completely inside an orthogonal projection of the transmitter coil TX, and where an orthogonal projection of the TX coil has a symmetry axis Y (apart from the cross-over junctions), is not known in the art. And as far as is known to the inventors, also the technical effect that this reduces the capacitive coupling between the coil TX coil and an RX coil situated therein, is not known in the art.

This structure may be used in proximity sensor devices as described above, but may also be used for other applications, for example in integrated transformers.

While the invention has been described primarily for a target in the form of a metal sheet with openings, the present invention is not limited thereto, and will also works for another electrically conductive target, for example a printed circuit board with one or more electrically conductive zones/areas and electronically non-conductive zones/areas. The latter may be physical openings in the printed circuit board, or simply zones without metal planes or metal tracks.

The invention claimed is:

1. A proximity sensor device, comprising a single monolithic integrated semiconductor substrate comprising:
   an active surface, the active surface comprising at least one component selected from the group consisting of:
      an active component, a passive component, and a bond pad;
   an interconnection stack on top of the active surface, the interconnection stack comprising a plurality of at least two metal layers separated by isolation layers;
   at least a first transmitter coil and a first receiver coil electrically insulated from one another,
   the first transmitter coil having a first spiral course with at least three turns formed in a first subset of at least one metal layer selected from said plurality of metal layers, and
   wherein an orthogonal projection of the first spiral course on the active substrate has a first inner periphery and a first outer periphery;
   the first receiver coil having a second spiral course with at least three turns formed in a second subset of at least one metal layer selected from said plurality of metal layers, and
   wherein an orthogonal projection of the second spiral course on the active substrate has a second inner periphery and a second outer periphery;
   wherein said at least one component or bond pad is located inside the first inner periphery and inside the second inner periphery, or is located inside the first inner periphery but outside of the second outer periphery.

2. The proximity sensor device according to claim 1,
   wherein the first transmitter coil is formed in only one metal layer, and the first receiver coil is formed in only one metal layer being the same metal layer in which the transmitter coil is formed; or
   wherein the first transmitter coil is formed in only one metal layer, and the first receiver coil is formed in only one metal layer different from the metal layer in which the transmitter coil is formed; or
   wherein the first transmitter coil is formed in a first subset of the interconnection stack, the first subset containing at least two metal layers; and
   wherein the first subset and the second subset have at least one metal layer in common; or
   wherein the first transmitter coil is formed in a first subset of the interconnection stack, the first subset containing at least two metal layers; and
   wherein the first receiver coil is formed in a second subset of the interconnection stack, the second subset containing at least two metal layers; and
   wherein the first subset and the second subset have at least one or at least two metal layers in common.

3. The proximity sensor device according to claim 1, further comprising:
   a transmitter circuit comprised in said active surface, and connected to the first transmitter coil, and configured for transmitting an alternating signal;
   a receiver circuit comprised in said active surface, and connected to the first receiver coil, and configured for receiving said alternating signal;
   an evaluation circuit comprised in or connected to the receiver circuit, and configured for determining a condition of an electrically conductive target or a magnetic target, based on the received alternating signal.

4. The proximity sensor device according to claim 3, wherein the evaluation circuit is further configured for determining whether the target is in a first predefined position or a second predefined position, and for outputting a corresponding signal or value, or for opening or closing an internal switch between two terminals of the proximity sensor device.

5. The proximity sensor device according to claim 1, wherein an orthogonal projection of the outer periphery of the at least one receiver coil is situated completely within an orthogonal projection of the inner periphery of the first transmitter coil.

6. The proximity sensor device according to claim 1,
   further comprising at least one metal shield in the form of a plurality of at least two tracks located on top of each other in at least two layers of the interconnection stack, said tracks being interconnected by a plurality of vias;
   said metal shield being located between the inner periphery of the transmitter coil and the outer periphery of the receiver coil.

7. The proximity sensor device according to claim 1, comprising only two coils, namely said first transmitter coil and said first receiver coil; and
   wherein the area between the inner and outer periphery of the transmitter coil amounts to 36% to 44% of the active area; and wherein the area between the inner and outer periphery of the receiver coil Rx1 amounts to 15% to 25% of the active area.

8. The proximity sensor device according to claim 1, wherein the substrate further comprises a second receiver coil electrically insulated from the first transmitter coil; the second receiver coil having a third spiral course with at least three turns formed in a third subset of at least one or at least two metal layers selected from said plurality of metal layers; wherein the first subset and the third subset share at least one metal layer; and wherein an orthogonal projection of the third spiral course on the active surface is situated completely within the inner periphery of the first transmitter coil.

9. The proximity sensor device according to claim 8, comprising only three coils, namely said first transmitter coil and said first and said second receiver coil; and wherein the area between the inner and outer periphery of the first transmitter coil amounts to 36% to 44% of the active area; and wherein the area between the inner and outer periphery of the first receiver coil amounts to 12% to 18% of the active area; and wherein the area between the inner and outer periphery of the second receiver coil amounts to 12% to 18% of the active area.

10. The proximity sensor device according to claim 1, wherein the substrate further comprises a second receiver coil and a second transmitter coil; wherein the second receiver coil is electrically insulated from the first transmitter coil and from the second transmitter coil, and wherein the second transmitter coil is electrically insulated from the first receiver coil and the second receiver coil; the second receiver coil having a third spiral course formed in the same at least one layer as the first receiver coil, wherein an orthogonal projection of the third spiral course on the active substrate defines a third inner periphery and a third outer periphery; the second transmitter coil having a fourth spiral course formed in the same at least one layer as the first transmitter coil, wherein an orthogonal projection of the fourth spiral course on the active substrate defines a fourth inner periphery and a fourth outer periphery; wherein the outer periphery of the second transmitter coil is situated completely outside the outer periphery of the first transmitter coil; and wherein the outer periphery of the first receiver coil is situated completely inside the inner periphery of the first transmitter coil; and wherein the outer periphery of the second receiver coil is situated completely inside the inner periphery of the second receiver coil.

11. The proximity sensor device according to claim 10, wherein each of the first and second transmitter coil comprises three spirals connected in parallel, the spirals being implemented in three metal layers and each having 22 to 32 turns; and wherein each of the first and second receiver coil comprises two spirals connected in series, the spirals being implemented in two or in three metal layers and each having 30 to 40 turns.

12. The proximity sensor device according to claim 10, comprising only four coils; and wherein the sum of the area between the inner and outer periphery of the first transmitter coil and the area between the inner and outer periphery of the second transmitter coil amounts to 35% to 45% of the active area; and wherein the sum of the area between the inner and outer periphery of the first receiver coil and the area between the inner and outer periphery of the second receiver coil amounts to 20% to 28% of the active area; and wherein at least 1% of the combined area inside the inner peripheries of the first and second receiver coils is occupied by one or more active or passive components or bond pads.

13. The proximity sensor device according to claim 1, wherein the first transmitter coil comprises a stack of at least two spiral windings formed on top of each other, one spiral in each layer of said first subset of metal layers; wherein adjacent spirals are interconnected by means of a plurality of vias which are spaced apart by less than 100 micron, preferably less than 50 micron, or less than 20 micron, or less than 10 micron, or less than 5 micron, e.g. of about 4 micron, or about 3 micron, or about 2 micron.

14. The proximity sensor device according to claim 1, wherein each of the turns of the first transmitter coil has a substantially equal rectangular cross section, each having a predefined height in a direction perpendicular to the semiconductor substrate and a predefined width parallel to the semiconductor substrate; and wherein a ratio of a sum of said heights and an average of said widths is smaller than 1.

15. The proximity sensor system comprising: a proximity sensor device according to claim 1; and an electrically conductive target or a magnetic target movable along a predefined trajectory relative to the proximity sensor device between a first position and a second position.

16. The proximity sensor system according to claim 15, wherein the metal target is movable in a predefined direction parallel to the semiconductor substrate; and wherein an amount of overlap between a projection of the metal target and the inner periphery of the at least one receiver coil is different when the target is in its first position or in its second position; and wherein the evaluation circuit is configured for determining whether the target is in its first or second position depending on the amount of overlap.

17. The proximity sensor system according to claim 15, comprising: at least two monolithic integrated of said proximity sensor devices; a metal target movable relative to said at least two proximity sensor devices.

18. The proximity sensor system according to claim 15, wherein the proximity sensor device comprises a semiconductor substrate; and wherein the predefined trajectory is substantially parallel to said semiconductor substrate, and is located at a predefined distance from said semiconductor substrate.

19. The proximity sensor system according to claim 15, wherein a ratio of a total area of said semiconductor substrate including the first transmitter coil and the first receiver coil when expressed in mm$^2$ and said predefined distance when expressed in mm is smaller than 2.75, or smaller than 2.0, or smaller than 1.25.

20. A seatbelt buckle comprising a proximity sensor device according to claim 1.

21. An integrated circuit comprising:
   a semiconductor substrate;
   an interconnection stack comprising a plurality of metal layers on top of the semiconductor substrate;
   a coil arrangement comprising a transmitter coil and a receiver coil, both implemented in one or more layers of the interconnection stack, each of the transmitter coil and the receiver coil comprising at least one spiral, each spiral comprising at least three windings,
   where an orthogonal projection of the receiver coil is located completely inside an orthogonal projection of the transmitter coil; and
   wherein an orthogonal projection of the transmitter coil has a symmetry axis and has one or more cross-over junctions situated on that symmetry axis.

22. An integrated transformer comprising an integrated circuit according to claim 21.

\* \* \* \* \*